United States Patent
Chandra et al.

(10) Patent No.: US 8,286,111 B2
(45) Date of Patent: Oct. 9, 2012

(54) THERMAL SIMULATION USING ADAPTIVE 3D AND HIERARCHICAL GRID MECHANISMS

(75) Inventors: Rajit Chandra, Cupertino, CA (US);
John Yanjiang Shu, Livermore, CA (US); Adi Srinivasan, Fremont, CA (US); Paolo Carnevali, San Jose, CA (US)

(73) Assignee: Gradient Design Automation Inc., Santa Clara, CA (US)

( * ) Notice: Subject to any disclaimer, the term of this patent is extended or adjusted under 35 U.S.C. 154(b) by 1078 days.

(21) Appl. No.: 12/131,821

(22) Filed: Jun. 2, 2008

(65) Prior Publication Data

US 2009/0024347 A1    Jan. 22, 2009

Related U.S. Application Data

(63) Continuation-in-part of application No. 11/317,664, filed on Dec. 23, 2005, now abandoned, which is a continuation-in-part of application No. 11/317,670, filed on Dec. 23, 2005, now abandoned, and a continuation-in-part of application No. 11/317,668, filed on Dec. 23, 2005, now Pat. No. 7,472,363, and a continuation-in-part of application No. PCT/US2006/062184, filed on Dec. 15, 2006, application No. 12/131,821, which is a continuation-in-part of application No. 12/101,983, filed on Apr. 12, 2008, now Pat. No. 8,019,580, and a (Continued)

(51) Int. Cl.
*G06F 17/50* (2006.01)
(52) U.S. Cl. .................................................. 716/110
(58) Field of Classification Search .................. 716/100, 716/110
See application file for complete search history.

(56) References Cited

U.S. PATENT DOCUMENTS 4,696,578 A    9/1987    Mansuria et al.
(Continued)

FOREIGN PATENT DOCUMENTS

WO    2007/019531 A2    2/2007
(Continued)

OTHER PUBLICATIONS

The International Technology Roadmap for Semiconductors, 2003 Edition, Executive Summary, published by the Semiconductor Industry Association et al., 2003; 75 pages.

(Continued)

*Primary Examiner* — Suchin Parihar
(74) *Attorney, Agent, or Firm* — PatentVentures; Bennett Smith; Korbin Van Dyke

(57) ABSTRACT

A thermally aware design automation suite integrates system-level thermal awareness into design of semiconductor chips, performing fine-grain static and/or transient thermal simulations of the chips based on thermal models and boundary conditions. The thermal simulations are performed in accordance with one or more grids, with boundaries and/or resolutions being determined by adaptive and/or hierarchical multi-dimensional techniques. The adaptive grid techniques include material-boundary, rate-of-change, and convergence-information heuristics. For example, a finer grid is used in a region having higher temperature gradients compared to a region having lower temperature gradients. The hierarchical grid techniques are based on critical, intermediate, and boundary regions specified manually or automatically, each region having a respective grid resolution. For example, a critical region is analyzed according to a grid that is finer than a grid of an intermediate region, and resolution of a grid of a boundary region is adapted to boundary conditions.

38 Claims, 10 Drawing Sheets

Related U.S. Application Data continuation-in-part of application No. 11/215,783, filed on Aug. 29, 2005, now Pat. No. 7,458,052, and a continuation-in-part of application No. 11/198,467, filed on Aug. 5, 2005, now Pat. No. 7,383,520, and a continuation-in-part of application No. 11/198,470, filed on Aug. 5, 2005, now Pat. No. 7,353,471, and a continuation-in-part of application No. 11/180,353, filed on Jul. 13, 2005, now Pat. No. 7,401,304, and a continuation-in-part of application No. 11/078,047, filed on Mar. 11, 2005, now Pat. No. 7,191,413, and a continuation-in-part of application No. 11/039,737, filed on Jan. 20, 2005, now Pat. No. 7,203,920, and a continuation-in-part of application No. 10/979,957, filed on Nov. 3, 2004, now Pat. No. 7,194,711.

(60) Provisional application No. 60/751,376, filed on Dec. 17, 2005, provisional application No. 60/744,405, filed on Apr. 6, 2006, provisional application No. 60/911,516, filed on Apr. 12, 2007, provisional application No. 60/917,185, filed on May 10, 2007, provisional application No. 60/941,660, filed on Jun. 2, 2007, provisional application No. 60/734,372, filed on Nov. 7, 2005, provisional application No. 60/718,138, filed on Sep. 16, 2005, provisional application No. 60/689,592, filed on Jun. 10, 2005, provisional application No. 60/658,324, filed on Mar. 3, 2005, provisional application No. 60/658,323, filed on Mar. 3, 2005, provisional application No. 60/552,375, filed on Mar. 11, 2004, provisional application No. 60/587,313, filed on Jul. 13, 2004, provisional application No. 60/598,987, filed on Aug. 5, 2004, provisional application No. 60/599,098, filed on Aug. 5, 2004, provisional application No. 60/599,278, filed on Aug. 5, 2004, provisional application No. 60/605,889, filed on Aug. 30, 2004, provisional application No. 60/539,727, filed on Jan. 28, 2004.

(56) References Cited

U.S. PATENT DOCUMENTS

| | | | |
|---|---|---|---|
| 5,654,904 | A | 8/1997 | Thakur |
| 5,710,068 | A | 1/1998 | Hill |
| 5,831,249 | A | 11/1998 | Rohner et al. |
| 5,838,578 | A | 11/1998 | Pippin |
| 5,927,853 | A | 7/1999 | Christiaens et al. |
| 5,997,174 | A | 12/1999 | Wyland |
| 6,124,635 | A | 9/2000 | Kuwabara et al. |
| 6,172,337 | B1 | 1/2001 | Johnsgard et al. |
| 6,203,191 | B1 | 3/2001 | Mongan |
| 6,247,161 | B1 | 6/2001 | Lambrecht et al. |
| 6,320,201 | B1 | 11/2001 | Corbett et al. |
| 6,334,013 | B1 | 12/2001 | Laming et al. |
| 6,389,582 | B1 | 5/2002 | Valainis et al. |
| 6,505,326 | B1 | 1/2003 | Farral et al. |
| 6,532,570 | B1 | 3/2003 | Mau |
| 6,591,399 | B1 | 7/2003 | Wyrzykowska et al. |
| 6,591,402 | B1 | 7/2003 | Chandra et al. |
| 6,634,013 | B2 | 10/2003 | Shinzawa |
| 6,662,345 | B2 | 12/2003 | Uchida et al. |
| 6,751,781 | B2 | 6/2004 | Lin et al. |
| 6,769,102 | B2 | 7/2004 | Frank et al. |
| 6,910,812 | B2 | 6/2005 | Pommer et al. |
| 6,931,369 | B1 | 8/2005 | Perry et al. |
| 6,993,742 | B2 | 1/2006 | Fryer et al. |
| 7,025,280 | B2 | 4/2006 | Kaushal et al. |
| 7,039,888 | B2 | 5/2006 | Steinmann et al. |
| 7,096,450 | B2 | 8/2006 | Gill et al. |
| 7,162,402 | B2 | 1/2007 | Daems et al. |
| 7,171,346 | B1 | 1/2007 | Recker et al. |
| 7,191,112 | B2 | 3/2007 | Demler et al. |
| 7,191,413 | B2 | 3/2007 | Chandra et al. |
| 7,194,711 | B2 | 3/2007 | Chandra |
| 7,203,920 | B2 | 4/2007 | Chandra |
| 7,263,477 | B2 | 8/2007 | Chen et al. |
| 7,353,471 | B1 | 4/2008 | Chandra et al. |
| 7,383,520 | B2 | 6/2008 | Chandra |
| 7,401,304 | B2 | 7/2008 | Li et al. |
| 2001/0032330 | A1 | 10/2001 | Kusunoki |
| 2002/0050833 | A1 | 5/2002 | Jones et al. |
| 2003/0145296 | A1 | 7/2003 | Chandra et al. |
| 2003/0226122 | A1 | 12/2003 | Hathaway et al. |
| 2004/0044426 | A1* | 3/2004 | Ueda et al. ............ 700/90 |
| 2005/0044515 | A1 | 2/2005 | Acar et al. |
| 2005/0058178 | A1 | 3/2005 | Shih et al. |
| 2005/0138581 | A1 | 6/2005 | Usui |
| 2005/0149886 | A1 | 7/2005 | Kaushal et al. |
| 2005/0155004 | A1 | 7/2005 | Miura et al. |
| 2005/0166166 | A1 | 7/2005 | Chandra et al. |
| 2005/0166168 | A1 | 7/2005 | Chandra |
| 2005/0210425 | A1 | 9/2005 | Keller et al. |
| 2006/0031794 | A1* | 2/2006 | Li et al. ................ 716/4 |
| 2007/0120239 | A1 | 5/2007 | Chandra |
| 2007/0157137 | A1 | 7/2007 | Chandra |

FOREIGN PATENT DOCUMENTS

| | | | |
|---|---|---|---|
| WO | 2007/019531 | A3 | 2/2007 |
| WO | 2007/070879 | A1 | 6/2007 |

OTHER PUBLICATIONS

The International Technology Roadmap for Semiconductors, 2003 Edition, System Drivers, published by the Semiconductor Industry Association et al., 2003; 24 pages.

The International Technology Roadmap for Semiconductors, 2003 Edition, Design, published by the Semiconductor Industry Association et al., 2003; 43 pages.

The International Technology Roadmap for Semiconductors, 2003 Edition, Test and Test Equipment, published by the Semiconductor Industry Association et al., 2003; 63 pages.

The International Technology Roadmap for Semiconductors, 2003 Edition, Process Integration, Devices and Structures; Includes RF and Analog/Mixed-Signal Technologies for Wireless Communications and Emerging Research Devices, published by the Semiconductor Industry Association et al., 2003; 41 pages.

The International Technology Roadmap for Semiconductors, 2003 Edition, Radio Frequency and Analog/Mixed-Signal Technologies for Wireless Communications [A Section of the Process Integration Chapter], published by the Semiconductor Industry Association et al., 2003; 40 pages.

The International Technology Roadmap for Semiconductors, 2003 Edition, Emerging Research Devices, published by the Semiconductor Industry Association et al., 2003; 53 pages.

The International Technology Roadmap for Semiconductors, 2003 Edition, Front End Processes, published by the Semiconductor Industry Association et al., 2003; 62 pages.

The International Technology Roadmap for Semiconductors, 2003 Edition, Lithography, published by the Semiconductor Industry Association et al., 2003; 20 pages.

The International Technology Roadmap for Semiconductors, 2003 Edition, Interconnect, published by the Semiconductor Industry Association et al., 2003; 45 pages.

The International Technology Roadmap for Semiconductors, 2003 Edition, Factory Integration, published by the Semiconductor Industry Association et al., 2003; 42 pages.

The International Technology Roadmap for Semiconductors, 2003 Edition, Assembly and Packaging, published by the Semiconductor Industry Association et al., 2003; 24 pages.

The International Technology Roadmap for Semiconductors, 2003 Edition, Environment, Safety, and Health, published by the Semiconductor Industry Association et al., 2003; 27 pages.

The International Technology Roadmap for Semiconductors, 2003 Edition, Yield Enhancement, published by the Semiconductor Industry Association et al., 2003; 39 pages.

The International Technology Roadmap for Semiconductors, 2003 Edition, Metrology, published by the Semiconductor Industry Association et al., 2003; 40 pages.

The International Technology Roadmap for Semiconductors, 2003 Edition, Modeling and Simulation, published by the Semiconductor Industry Association et al., 2003; 27 pages.

Yi-Kan Cheng, Prasun Raha, Chin-Chi Teng, Elyse Rosenbaum, Sung-Mo Kang; Illiads-T: An Electrothermal Timing Simulator for Temperature-Sensitive Reliability Diagnosis of CMOS VLSI Chips; IEEE Transactions on Computer-Aided Design of Integrated Circuits and Systems, vol. 17, No. 8, Aug. 1998, pp. 668-681.

Sven Rzepka, Kaustav Banerjee, Ekkehard Meusel, and Chenming Hu; Characterization of Self-Heating in Advanced VLSI Interconnect Lines Based on Thermal Finite Element Simulation; IEEE Transactions on Components, Packaging, and Manufacturing Technology—Part A, vol. 21, No. 3, Sep. 1998, pp. 406-411.

Yi-Kan Cheng, Ching-Han Tsai, Chin-Chi Teng, Elyse Rosenbaum, Sung-Mo (Steve) Kang; Electrothermal Analysis of VLSI Systems; Kluwer Academic Publishers, 2000, 116 pages.

Kaustav Banerjee, Amit Mehrotra, Alberto Sangiovanni-Vincentelli, Chenming Hu; On Thermal Effects in Deep Sub-Micron VLSI Interconnects; Proceedings of IEEE/ACM DAC 1999, pp. 885-891.

Ting-Yen Chiang, Kaustav Banerjee, Krishna C. Saraswat; Comact Modeling and SPICE-Based Simulation for Electrothermal Analysis of Multilevel ULSI Interconnects; Proceedings of IEEE/ACM ICCAD, 2001, pp. 165-172.

Zhiping Yu, Daniel Yergeau, Robert W. Dutton, Sam Nakagawa, and Jeff Deeney; Fast Placement-Dependent Full Chip Thermal Simulation; Proceedings of International Symposium on VLSI Technology, Systems and Applications, 2001, pp. 249-252.

Haihua Su, Frank Liu, Anirudh Devgan, Emrah Acar, Sani Nassif; Full Chip Leakage Estimation Considering Power Supply and Temperature Variations; ISLPED'03, Aug. 25-27, 2003, Seoul, Korea, pp. 78-83.

Kevin Skadron, Mircea R. Stan, Wei Huang, Sivakumar Velusamy, Karthik Sankaranarayanan, and David Tarjan; Temperature-Aware Microarchitecture; Proceedings of the 30th International Symposium on Computer Architecture, 2003, 12 pages.

Ching-Han Tsai and Sung-Mo (Steve) Kang; Cell-Level Placement for Improving Substrate Thermal Distribution; IEEE Transactions on Computer-Aided Design of Integrated Circuits and Systems, vol. 19, No. 2, Feb. 2000, pp. 253-266.

Brent Goplen and Sachin Sapatnekar; Efficient Thermal Placement of Standard Cells in 3D ICs using a Force Directed Approach; Proceedings of the International Conference on Computer Aided Design (ICCAD'03), pp. 86-89.

Gary B. Kromann; Thermal Management of a C4/Ceramic-Ball-Grid Array: The Motorola PowerPC603TM and PowerPC604TM RISC Microprocessors; Twelfth IEEE Semi-THERMTM Symposium, 1996, pp. 36-42.

Stephen H. Gunther, Frank Binns, Douglas M. Carmean, Jonathan C. Hall; Managing the Impact of Increasing Microprocessor Power Consumption; Intel Technology Journal Q1, 2001, 9 pages.

Tomas Skalicky; LASPack Reference Manual (version 1.12.2), Dresden University of Technology Institute for Fluid Mechanics, Aug. 13, 1995, 52 pages.

Vivek DE and Shekhar Borkar; Technology and Design Challenges for Low Power and High Performance; Proceedings of the International Symposium Low Power Electronics and Design, San Diego, CA, 1999, pp. 163-168.

James R. Black, Electromigration Failure Modes in Aluminum Metallization for Semiconductor Devices; Proceedings of the IEEE, vol. 57, No. 9, Sep. 1969, 14 pages.

Ting-Yuan Wang et al., 3D Thermal-ADI—An Efficient Chip-Level Transient Thermal Simulator, ISPD'03, Apr. 6-9, 2003, Monterey, California, 8 pages.

Ting-Yuan Wang et al., Thermal-ADI—A Linear-Time Chip-Level Dynamic Thermal-Simulation Algorithm Based on Alternating-Direction-Implicit (ADI) Method, IEEE Transactions on Very Large Scale Integration (VLSI) systems, vol. 11, No. 4, Aug. 2003, pp. 691-700.

Ting-Yuan Wang et al., 3D Thermal-ADI: A Linear-Time Chip Level Transient Thermal Simulator, IEEE Transactions on Computer-Aided Design of Integrated Circuits and Systems, vol. 21, No. 12, Dec. 2002, pp. 1434-1445.

Ting-Yuan Wang et al., Thermal-ADI: A Linear-Time Chip-Level Dynamic Thermal Simulation Algorithm Based on Alternating-Direction-Implicit (ADI) Method, ISPD'01, Apr. 1-4, 2001, Sonoma, California, 6 pages.

"Design Flow", Carleton University, Copyright John Knight, Revised; Sep. 30, 2003, pp. 1-22.

"Stratix II High-Speed Development Board", Data Sheet, Altera Corporation, Sep. 2004, ver.1.0, pp. 1-85.

Szekely V. et al.: "A thermal benchmark chip: design and applications", Part A, IEEE Transactions on Components, Packaging, and Manufacturing Technology, vol. 21, No. 3, Sep. 1998, pp. 399-405.

Hang L. et al.: "Efficient thermal stimulation for run-time temperature tracking and management", Computer Design: VLSI in Computers and Processors, ICCD 2005 Proceedings, IEEE International Conference Oct. 2, 2005-Oct. 5, 2005, 4 pages.

International Search Report and Written Opinion for PCT/US2006/062184; mailed May 7, 2007; 11 pages.

Yonghong Yang et al.; Adaptive Chip-Package Thermal Analysis for Synthesis and Design; Design, Automation and Test in Europe, 2006. Date '06. Proceedings; Mar. 6-10, 2006; 6 pgs.

Yonghong Yang et al.; Adaptive multi-domain thermal modeling and analysis for integrated circuit synthesis and design; Computer-Aided Design, ICCAD '06. IEEE/ACM International Conference, Nov. 2006; pp. 575-582.

Table of Jul. 22, 2009 identifying references used to reject claims in related applications; 1 page.

Kaustav Banerjee et al., High-Current Failure Model for VLSI Interconnects Under Short-Pulse Stress Conditions, IEEE Electron Device Letters, vol. 18, No. 9, Sep. 1997, pp. 405-407.

Kaustav Banerjee et al., The Effect of Interconnect Scaling and Low-k Dielectric on the Thermal Characteristics of the IC Metal, Electron Devices Meeting, 1996, International, Dec. 8-11, 1996, San Francisco, CA, USA, pp. 65-68.

Wei Huang et al., 51.3 Compact Thermal Modeling for Temperature-Aware Design, HPLP and LAVA labs, Departments of ECE and CS, University of Virginia, Jun. 10, 2004, 27 pgs.

Wei Huang et al., Compact Thermal Modeling for Temperature-Aware Design, DAC 2004 Jun. 7-11, 2004, San Diego, California, USA, pp. 878-883.

Amir H. Ajami et al., Analysis of Substrate Thermal Gradient Effects on Optimal Buffer Insertion, Presentation Outline, ICCAD '01, Nov. 5, 2001, 29 slides on 5 pgs.

Amir H. Ajami et al., Analysis of Substrate Thermal Gradient Effects on Optimal Buffer Insertion, ICCAD '01, Proceedings of the 2001 IEEE/ACM international conference on Computer-aided design, Nov. 5, 2001, San Jose, California, pp. 44-48.

Amir H. Ajami et al., Analysis of Non-Uniform Temperature-Dependent Interconnect Performance in High Performance Ics, DAC'01, Jun. 18-22, 2001, Las Vegas, Nevada, USA, 6 pgs.

Kaustav Banerjee et al., Analysis and Optimization of Thermal Issues in High-Performance VLSI, ISPD'01, Apr. 1-4, 2001, Sonoma, California, USA, pp. 230-237.

Kaustav Banerjee et al., Analysis and Optimization of Thermal Issues in High Performance VLSI, Presentation Outline, ISPD 2001, 57 slides on 10 pgs.

Amir H. Ajami et al., Non-Uniform Chip-Temperature Dependent Signal Integrity, Digest of Technical Papers, 2001 Symposium on VLSI Technology, Jun. 12-14, 2001, Kyoto, Japan, 2 pgs.

Amir H. Ajami et al., Effects of Non-uniform Substrate Temperature on the Clock Signal Integrity in High Performance Designs, IEEE Conference on Custom Integrated Circuits, San Diego, CA, USA, May 6-9, 2001, 4 pgs.

Amir H. Ajami et al., Effects of Non-Uniform Substrate Temperature on the Clock Signal Integrity in High Performance Designs, Presentation Outline, CICC'01, May 8, 2001, 26 slides on 5 pgs.

Ting-Yuan Wang et al., Thermal-ADI—A Linear-Time Chip-Level Dynamic Thermal-Simulation Algorithm Based on Alternating-Direction-Implicit (ADI) Method, Poster, University of Wisconsin, 2003, 1 pg.

Ting-Yuan Wang et al., SPICE-Compatible Thermal Simulation with Lumped Circuit Modeling for Thermal Reliability Analysis based on Modeling Order Reduction, Proceedings of the 5th International Symposium on Quality Electronic Design, Mar. 22-24, 2004, 6 pgs.

Rajit Chandra, Impact of Thermal Analysis on Large Chip Design, Outline, Electronic Design Process Symposium Monterey, CA, Apr. 7, 2005, 25 pgs.

Peng Li, Efficient Full-Chip Thermal Modeling and Analysis, Proceedings of the 2004 IEEE/ACM International conference on Computer-aided design, Nov. 7-11, 2004, pp. 319-326.

Vladimir Koval et al., MONSTR: a complete thermal simulator of electronic systems, Proceedings of the 31st annual conference on Design Automation, San Diego, California, Jun. 6-10, 1994, 6 pgs.

Rajit Chandra, A thermal-aware IC design methodology, http://www.eetimes.com/showArticle.jhtml?articleID=164302273&printable=true, Jun. 13, 2005, 7 pgs.

Sheng-Chih Lin and Kaustav Banerjee, "Cool Chips: Opportunities and Implications for Power and Thermal Management", IEEE Transactions on Electron Devices, vol. 55, No. 1, Jan. 2008 pp. 245-255.

International Search Report and Written Opinion for PCT/US2006/030940; mailed Aug. 24, 2007; 4 pages.

* cited by examiner

THERMAL SIMULATION USING ADAPTIVE 3D AND HIERARCHICAL GRID MECHANISMS

CROSS REFERENCE TO RELATED APPLICATIONS

Priority benefit claims for this application are made in the accompanying Application Data Sheet, Request, or Transmittal (as appropriate, if any). To the extent permitted by the type of the instant application, this application incorporates by reference for all purposes the following applications, all owned by the owner of the instant application:

U.S. application Ser. No. 11/317,664 filed Dec. 23, 2005, first named inventor Rajit Chandra, and entitled Method and Apparatus for Thermally Aware Design Improvement;

U.S. application Ser. No. 11/317,670 filed Dec. 23, 2005, first named inventor Rajit Chandra, and entitled Method and Apparatus for Generating and Using Thermal Test Vectors;

U.S. application Ser. No. 11/317,668 filed Dec. 23, 2005, first named inventor Rajit Chandra, and entitled Semiconductor Chip Design Having Thermal Awareness Across Multiple Sub-System Domains;

PCT Application Serial No. PCT/US06/62184 filed Dec. 15, 2006, first named inventor Rajit Chandra, entitled Simulation of IC Temperature Distributions Using an Adaptive 3D Grid;

U.S. Provisional Application Ser. No. 60/941,660, filed Jun. 2, 2007, first named inventor Rajit Chandra, and entitled Simulation of IC Temperature Distributions Using a Hierarchical Grid; and U.S. Non-Provisional application Ser. No. 12/101,983, filed Apr. 12, 2008, first named inventor Rajit Chandra, and entitled Transient Thermal Analysis.

BACKGROUND

1. Field

Advancements in integrated circuit design are needed to provide improvements in performance, efficiency, and utility of use.

2. Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes.

SYNOPSIS

The invention may be implemented in numerous ways, including as a process, an article of manufacture, an apparatus, a system, and a computer readable medium such as a computer readable storage medium (e.g. media in an optical and/or magnetic mass storage device such as a disk, or an integrated circuit having non-volatile storage such as flash storage). In this specification, these implementations, or any other form that the invention may take, may be referred to as techniques. The Detailed Description provides an exposition of one or more embodiments of the invention that enable improvements in performance, efficiency, and utility of use in the field identified above. The Detailed Description includes an Introduction to facilitate the more rapid understanding of the remainder of the Detailed Description. The Introduction includes Example Embodiments of one or more of systems, methods, articles of manufacture, and computer readable media in accordance with the concepts described herein. As is discussed in more detail in the Conclusions, the invention encompasses all possible modifications and variations within the scope of the issued claims.

DETAILED DESCRIPTION

Figure 1:
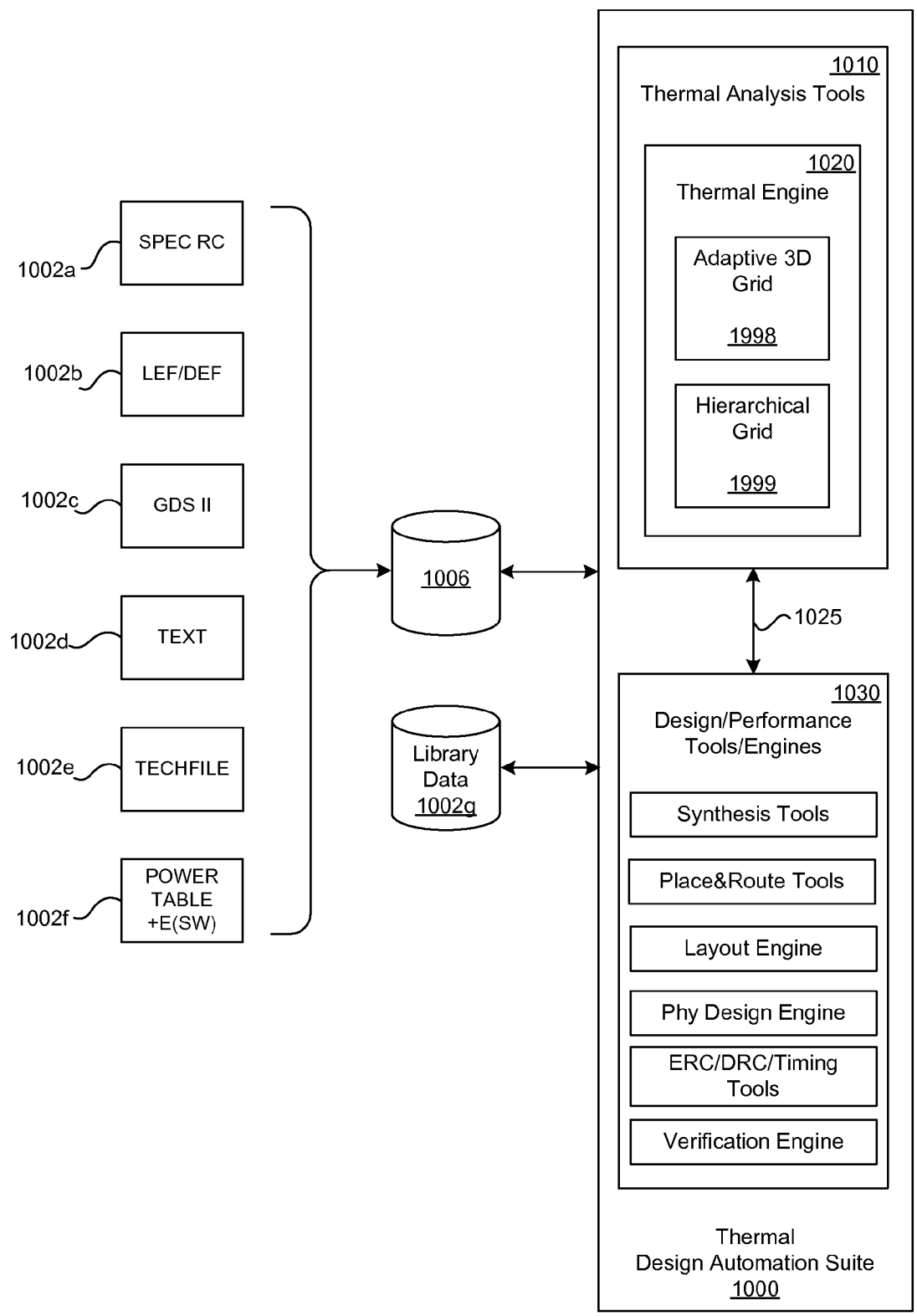
FIG. 1 illustrates selected components and operational environment elements of an embodiment of a thermally aware design automation suite with thermal simulation using adaptive 3D and hierarchical grid mechanisms.

A detailed description of one or more embodiments of the invention is provided below along with accompanying figures illustrating selected details of the invention. The invention is described in connection with the embodiments. The embodiments herein are understood to be merely exemplary, the invention is expressly not limited to or by any or all of the embodiments herein, and the invention encompasses numerous alternatives, modifications and equivalents. To avoid monotony in the exposition, a variety of word labels (including but not limited to: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Introduction

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

Acronyms

Elsewhere herein various shorthand abbreviations, or acronyms, are used to refer to certain elements. The descriptions of at least some of the acronyms follow.

| Acronym | Description |
| --- | --- |
| 2D | two-Dimensional |
| 3D | three-Dimensional |
| ASIC | Application Specific Integrated Circuit |
| BGA | Ball Grid Array |
| DEF | Design Exchange Format |
| DIP | Dual In line Package |
| DRC | (physical) Design Rule Checker |
| ERC | Electrical Rule Checker |
| GDSII | Graphics Design System II |
| GUI | Graphical User Interface |
| I/O | Input/Output |
| IC | Integrated Circuit |
| LEF | Library Exchange Format |
| PC | Personal Computer |
| RAM | Randomly Accessible Media |
| RC | Resistance-Capacitance |
| SPEF | Standard Parasitic Extraction File |

Terminology

An example of an Integrated Circuit (IC) is a package containing a die or a plurality of dice. Example packages are a DIP package and a BGA package. An example of a die is a monolithic electronic device formed from a semiconductor wafer via lithographic and chemical processing. An integrated circuit is also referred to as a "semiconductor chip" or alternatively as a "chip", and in some contexts semiconductor chip or chip alternatively refers to a die (of an integrated circuit).

An example of a steady state condition is a value or circumstance that is relatively unchanging (or completely fixed) for a length of time. An example of a transient condition is a value or circumstance that is changing for a length of time. In some situations, a signal voltage level or a temperature value is a relatively constant value for a first length of time, and then varying values for a second length of time. The level or value is an example of a steady state value during the first length of time, and a transient value during the second length of time. A steady state value, condition, or circumstance is optionally characterized as "DC".

Overview

A thermally aware design automation suite using adaptive 3D and hierarchical grid mechanisms integrates system-level thermal awareness into semiconductor chip design. A thermal analysis engine performs fine-grain thermal simulations of the semiconductor chip based on thermal models and boundary conditions for all thermally significant structures in the chip and the adjacent system that impact the temperature of the chip. The thermally aware design automation suite uses the simulations of the thermal analysis engine to repair or otherwise modify the thermally significant structures to equalize temperature variations across the chip, impose specified design assertions on selected portions of the chip, and verify overall chip performance and reliability over designated operating ranges and manufacturing variations. The thermally significant structures are introduced or modified via one or more of: change in number, change in location, and change in material properties.

A discretization approach effectively models semiconductor IC temperature distributions in multi-dimensional space using heuristics to adaptively and/or hierarchically grid the space in 3D and simultaneously apply (heat equation) mathematical operators to solve for temperatures within the grid points. Adaptive and locally variable grid spacing techniques and/or hierarchical grid spacing techniques are used to enable, in some usage scenarios, efficient and accurate convergence for steady state and/or transient temperature solutions, for example in contexts where some regions would benefit from relatively more computationally intensive analysis compared to other regions. In some usage scenarios, results of adaptive and/or hierarchical multi-dimensional grid-based temperature analyses are used in conjunction with repair and/or improvement strategies.

In a material-boundary adaptive aspect, grid boundaries are selectively defined between IC materials having differing thermal conductance and the grid size is a function of at least some design variables and material characteristics as the design variables and the material characteristics are locally applied. In a rate-of-change adaptive aspect, the grid size is a function of localized rates of change in at least some of the simulated thermally significant variables (e.g. power or temperature) and the localized grid size is recomputed as the simulation progresses. In a convergence-information adaptive aspect, the grid size is based on convergence information obtained as a simulation progresses. In a hierarchical aspect, one or more regions are specified, and each region is analyzed according to a respective grid having a respective resolution. The material-boundary, rate-of-change, and convergence-information adaptive aspects, along with the hierarchical aspect, are usable individually or in combination.

The temperature distribution modeling is optionally provided via a thermal analysis shell. The shell reads various input files, including a mesh initialization file that specifies selected aspects and parameters associated with controlling the use and behavior of the variable grid spacing techniques.

In some integrated circuit design flows, a temperature-aware analysis technique using adaptive 3D grid techniques, hierarchical grid techniques, or both, provides detailed temperature information for design improvements of chip designs. In some usage scenarios, a thermal analysis is used in conjunction with an electrical circuit simulation (such as Cadence Spectre) to provide a temperature-aware integrated circuit design flow. Multi-dimensional (such as two- or three-dimensional) temperature distributions are calculated for an integrated circuit and visualized, examined, and/or analyzed early in a design cycle (e.g. before taping out). Checking temperature is useful, in some usage scenarios, for predicting potential temperature hazards under steady state and/or transient temperature conditions. For example, some designs where absolute or relative temperature differences are important (e.g. bandgap reference circuitry, matched pairs, or other design constructs where temperature mismatch reduces performance) benefit from thermal analysis.

Some adaptive 3D grid analyses are based on local grid determinations made with respect to power and/or thermal distributions, and a design characteristic indexed knowledge base. A device is thermally simulated according to grids based on the local grid determinations. For example, a region found to have a relatively high temperature gradient during a first simulation time interval of a thermal transient analysis is analyzed according to a relatively finer grid, enabling more accurate simulation. At a later simulation time of the analysis, when the region is found to have a relatively low temperature gradient, the region is analyzed according to a relatively coarser grid, enabling more efficient simulation. In some embodiments, one or more split functions are used during adaptive 3D grid analyses. Split functions are, for example, particular grid point location functions used to define magnitude and direction of grid point spacing (in 3D). The split functions are optionally associated with design assertions, and optionally vary according to analysis phase.

Some hierarchical grid analyses are based on one or more regions each having a respective grid of a respective resolution. One or more critical, intermediate, and boundary region(s) are specified, either manually (such as by a user), or automatically (such as by a program). Each specified region is analyzed according to a respective grid having a respective resolution. A device is thermally simulated according to the respective grids. For example, critical regions are analyzed according to a relatively finer grid, enabling more accurate simulation. Other regions are analyzed according to relatively coarser grids, enabling more efficient simulation. The intermediate regions are optionally analyzed according to a grid having resolution computed to smoothly interpolate between resolutions of critical and boundary regions. Some of the regions are optionally analyzed according to a grid assigned in accordance with power sources. For example, finer grids are assigned where there are sharper variations in temperature, power density, and/or power distribution, and thus grid resolution is a function of attributes and shapes of the power sources. In some usage scenarios, critical regions are specified according to areas of interest of small geometries, such as vias or portions of wires.

In some integrated circuit design flows, layout and netlist data available in a physical design environment (such as a design environment from Cadence), is used in an automated flow that annotates instance-specific temperatures determined via a thermal simulator to an electrical simulator (such as Cadence Spectre) to obtain temperature-aware power from the electrical simulator. The thermal simulator optionally uses one or more adaptive 3D and hierarchical grid techniques. The resulting temperature information is used for floorplanning, area management, locating high-density power circuitry, and other design functions to reduce design guard bands and potential circuit malfunctions.

Some thermal-aware design automation techniques and functional sub-systems as described herein use three dimensional thermal analysis to develop simulated three dimensional chip temperature distributions to guide design changes to improve the temperature distribution (to meet chip design goals and avoid latent defects), to improve chip performance, and to improve chip reliability. One use of the thermal-aware techniques is to guide the selection between otherwise functionally interchangeable components, structures, or other design resources that are differentiated by respective thermal conductances, and thus are substituted, in some usage scenarios, to alter the chip temperature distribution to accomplish an intended result.

Thermal improvements (a.k.a. thermal repairs) of the design reduce, equalize, or smooth, temperatures in particular localized regions. Unimproved designs, in some usage scenarios, have poor performance, poor reliability, or both. Unanticipated localized heating, in some usage scenarios, problematically changes circuit behavior due to increased IR-drops, slower transitions, and longer delays. Undesirable temperature distributions, in some usage scenarios, unbalance otherwise balanced circuits and create signal integrity problems. Excessive temperature concentrations (hot spots), in some usage scenarios, exacerbate electromigration failure mechanisms.

Thermal improvements are achieved by the introduction or modification of thermally significant structures by, for example, a change in number, a change in location, or a change in material properties. Contemplated thermally significant structural modifications include: solder bump (e.g. C4-bump) location and density; solder-bump-related underfill composition; thermal via location, density, and metal composition; heat sink configuration including fin location, density, and height; metal fill location and density; wire location, width, and metal composition; bond wire location and density; and other thermally-related and thermally-affecting modifications.

Fabrication processes are contemplated to expand the available chip design resources (structure and/or components) to include otherwise equivalent components that are differentiated by respective thermal conductances. For example, the expanded fabrication processes enable at least some regions on at least one layer to be a selected one of a plurality of metallization types having respectively different elemental compositions. For example, a high heat conduction metal such as Ti, is optionally selectively used where enhanced thermal conductivity is needed or warranted. The special metallization is optionally used for vias, metal layers, or both. Vias (whether enhanced by special metallization or not) are optionally used to reduce local heating (e.g. for any of the reasons cited previously), to electrically couple circuitry on proximate metal layers, or both.

Simulation and analysis of IC temperature distributions using adaptive 3D and/or hierarchical grid techniques enables, in some usage scenarios, advanced IC design. Examples of adaptive 3D grid techniques are described in PCT application Serial No. PCT/US06/62184 filed Dec. 15, 2006, first named inventor Rajit Chandra, entitled Simulation of IC Temperature Distributions Using an Adaptive 3D Grid, and owned by the owner of the instant application. Adaptive 3D and/or hierarchical grid techniques are usable with transient thermal simulation of ICs, such as when a grid (e.g. a regional grid) is adjusted. Examples of transient thermal simulation of ICs are described in U.S. Non-Provisional application Ser. No. 12/101,983, filed Apr. 12, 2008, first named inventor Rajit Chandra, and entitled Transient Thermal Analysis.

Adaptive 3D and hierarchical grid techniques are applicable to full-chip thermal analysis of semiconductor chip designs and to retrofitting semiconductor chip performance analysis tools with full-chip thermal analysis capabilities. Examples of full-chip thermal analysis of semiconductor chip designs and of retrofitting semiconductor chip performance analysis tools with full-chip thermal analysis capabilities are described in U.S. Pat. No. 7,203,920, issued Apr. 10, 2007, first named inventor Rajit Chandra, entitled Method and Apparatus for Retrofitting Semiconductor Chip Performance Analysis Tools with Full-Chip Thermal Analysis Capabilities, and owned by the owner of the instant application.

Example Embodiments

In concluding the introduction to the detailed description, what follows is a collection of example embodiments, including at least some explicitly enumerated as "ECs" (Example Combinations), providing additional description of a variety of embodiment types in accordance with the concepts described herein; these examples are not meant to be mutually exclusive, exhaustive, or restrictive; and the invention is not limited to these example embodiments but rather encompasses all possible modifications and variations within the scope of the issued claims.

In various embodiments, various grid selection techniques (such as adaptive 3D techniques, hierarchical techniques, or both) enable run time efficiency of VLSI design heat transfer analysis. In various embodiments, the heat transfer analysis is according to a steady-state scenario, a transient scenario, or both.

In various embodiments, various grid techniques (such as adaptive 3D techniques, hierarchical techniques, or both) enable accurate determination of temperature distribution in scenarios with materials having varying conductivity and heat capacitance. In some embodiments, coarse grid partitioning is based on thermal properties related to thermal conductivity, power density, power source shape, power source sizes, power source positions in relation to other power sources and material boundaries, thermal time constants of self-heating, and thermal time constants of heat propagation.

In some embodiments, grid size (such as by adaptive 3D techniques, hierarchical techniques, or both) is determined based on a zone of influence of a thermal aggressor on a thermal victim (analogous to signal integrity). In some embodiments, repair techniques are used to minimize the influence of the aggressor. In some embodiments, the zone of influence is with respect to aggressor-victim sets. In some embodiments, techniques based on principles of superposition are used for multiple aggressors and optimization techniques for computation efficiency. In some embodiments, the thermal victim is a plurality of thermal victims. In some embodiments, thermal time constants of thermal aggressor-victim coupled sections are extracted.

In some embodiments based on adaptive 3D gridding, split functions using any combination of one or more of spatial heat distribution, power, power thresholds, power gradients, power gradient thresholds, static and/or transient temperature, temperature thresholds, temperature gradients, and temperature gradient thresholds are developed.

In some embodiments, split functions are enabled to adaptively optimize grid size based on a range of distribution criteria. In various embodiments, the range of distribution criteria are one or more of equal temperature gradients, equal power gradients, equal temperature profile based on shape factor and adiabatic temperature contours, power source shape, temperature rise or fall times, and other distribution criteria.

In some embodiments, split functions are used for transient thermal processing. In some embodiments, split functions are used for transient thermal processing and mapping to steady state grid sections.

EC1) A method including:
  determining power dissipations of devices and interconnects of an integrated circuit; and
  determining temperatures of the devices and the interconnects in accordance with the power dissipations; and
  wherein the determining power dissipations is in accordance with the temperatures.

EC2) The method of EC1 further including repeating the determining power dissipations and the determining temperatures until a specified termination condition is met.

EC3) The method of EC1 wherein the determining power dissipations is iterative.

EC4) The method of EC1 wherein the determining temperatures is iterative.

EC5) The method of EC1 wherein the determining temperatures is in accordance with a spatially-varying grid.

EC6) The method of EC1 wherein the determining temperatures is in accordance with a time-varying grid.

EC7) The method of EC1 wherein the determining power dissipations and the determining temperatures are repeated to model transient electrical behavior of the integrated circuit.

EC8) The method of EC1 wherein the determining power dissipations and the determining temperatures are repeated to model transient thermal behavior of the integrated circuit.

EC9) A method including:
  defining initial temperature conditions;
  defining an initial time step;
  determining a power distribution based on the initial temperature conditions;
  formulating an analysis grid based on the power distribution, the formulating optionally including adjusting spatial characteristics of the analysis grid;
  computing a trial temperature distribution in accordance with the power distribution;
  determining an error bound associated with the trial temperature distribution;
  if the error bound is greater than an error threshold, then decreasing a time step; and
  wherein the spatial characteristics include spacing of the analysis grid.

EC10) A method including:
  determining average power dissipation of an integrated circuit;
  determining an average temperature based on the average power dissipation and thermal resistance of a package of the integrated circuit;
  determining thermal capacitance of a die of the integrated circuit based on material properties of the die;
  determining thermal resistance of one or more elements of the die based on the material properties;
  determining a thermal RC network based at least on the thermal capacitance, the thermal resistances, and dimensions of one or more sections of the die; and
  determining a temperature distribution in space and time across the RC network based on power waveforms acting as driving functions to the RC network.

EC11) The method of EC10 wherein the average power dissipation is a function of duty cycle of a power source.

EC12) The method of EC10 wherein the average power dissipation is a function of pulse height of a power source.

EC13) The method of EC10 wherein the elements include power devices.

EC14) The method of EC13 wherein the elements further include neighbors of the power devices.

EC15) The method of EC10 wherein the material properties include one or more of a dimension, mass density, specific heat, and thermal conductivity.

EC16) The method of EC10 further including determining a temperature distribution of the package.

EC17) The method of EC10 further including determining a temperature distribution of pads of the integrated circuit.

EC18) The method of EC10 further including determining a temperature distribution of a printed circuit board the integrated circuit is mounted on.

EC19) The method of EC10 wherein the temperature distribution is a die temperature distribution and further including determining a package temperature distribution of the package.

EC20) The method of EC19 further including superimposing the die and the package temperature distributions to determine one or more maximum temperatures as a function of time.

EC21) A method including:
 determining one or more power samples by sampling one or more power waveforms at a current time interval;
 determining heat propagation for the current time interval between power source locations of a die of an integrated circuit and points of the die as a function of the power samples; and
 repeating the determining power samples and the determining heat propagation at a next time interval that is later in time than the current time interval.

EC22) The method of EC21 wherein the determining heat propagation is via a steady state temperature calculation mechanism.

EC23) A method including:
 modeling thermal behavior of an electrical device in accordance with a plurality of regions, each of the regions having a respective grid, and each of the grids having a respective resolution in at least one dimension; and
 specifying one or more of the regions.

EC24) The method of EC23 wherein the modeling is in a static modeling context.

EC25) The method of EC23 wherein the modeling is in a transient modeling context.

EC26) A method including:
 performing thermal simulation of an electronic element in accordance with a plurality of regions, each of the regions having a respective grid, and each of the grids having a respective resolution in at least one dimension; and
 specifying one or more of the regions.

EC27) The method of EC26 wherein the thermal simulation is a static thermal simulation.

EC28) The method of EC26 wherein the thermal simulation is a transient thermal simulation.

EC29) A method including:
 determining temperatures of an electronic device at grid points of a plurality of grids, each of the grids having a respective resolution in at least one dimension, and one or more of the grids corresponding to one or more regions; and
 specifying one or more of the regions.

EC30) A method including:
 modeling thermal behavior of an electrical device in accordance with a plurality of regions, at least some of the regions being specified regions, each of the specified regions having a respective grid, and each of the grids having a respective resolution in at least one dimension; and
 determining one or more of the respective resolutions.

EC31) The method of EC30 wherein the modeling is in a static modeling context.

EC32) The method of EC30 wherein the modeling is in a transient modeling context.

EC33) A method including:
 performing thermal simulation of an electronic element in accordance with a plurality of regions, at least some of the regions being specified regions, each of the specified regions having a respective grid, and each of the grids having a respective resolution in at least one dimension; and
 determining one or more of the respective resolutions.

EC34) The method of EC33 wherein the thermal simulation is a static thermal simulation.

EC35) The method of EC33 wherein the thermal simulation is a transient thermal simulation.

EC36) A method including:
 determining temperatures of an electronic device at grid points of a plurality of grids, each of the grids having a respective resolution in at least one dimension, and one or more of the grids corresponding to one or more specified regions of a plurality of regions; and
 determining one or more of the respective resolutions.

EC37) The method of any of EC23 to EC36 wherein at least one of the respective resolutions is fixed in at least one dimension.

EC38) The method of any of EC23 to EC36 wherein at least one of the respective resolutions is variable in at least one dimension.

EC39) The method of any of EC23 to EC36 wherein at least one of the respective resolutions is locally variable in at least one dimension.

EC40) The method of any of EC23 to EC36 wherein at least one of the respective resolutions is in accordance with a local boundary value.

EC41) The method of any of EC23 to EC36 wherein at least one of the grids is propagated in accordance with a local boundary value.

EC42) The method of any of EC23 to EC36 further including determining one or more local boundary values, and calculating at least one of the respective resolutions in accordance with the local boundary values.

EC43) The method of any of EC23 to EC36 further including determining one or more local boundary values, and propagating at least one of the grids in accordance with the local boundary values.

EC44) The method of any of EC23 to EC36 wherein the respective grids are multi-dimensional.

EC45) The method of any of EC23 to EC36 wherein the respective grids are two-dimensional.

EC46) The method of any of EC23 to EC36 wherein the respective grids are three-dimensional.

EC47) The method of any of EC23 to EC36 wherein at least one of the specified regions is at least partially manually specified.

EC48) The method of any of EC23 to EC36 wherein at least one of the specified regions is at least partially specified by a user.

EC49) The method of any of EC23 to EC36 wherein at least one of the specified regions is at least partially automatically specified.

EC50) The method of any of EC23 to EC36 wherein at least one of the specified regions is at least partially specified by software.

EC51) The method of any of EC23 to EC36 wherein at least one of the specified regions is based at least in part on a desired accuracy.

EC52) The method of any of EC23 to EC36 wherein at least one of the specified regions is based at least in part on a subsystem of a system.

EC53) The method of any of EC23 to EC36 wherein at least one of the specified regions is based at least in part on a finished subsystem of a system, design of the finished subsystem being finished, and design of an unfinished subsystem of the system being unfinished.

EC54) The method of any of EC23 to EC36 wherein at least one of the specified regions is based at least in part on a finished one of a plurality of subsystems of a system.

EC55) The method of any of EC23 to EC36 wherein at least one of the specified regions is based at least in part on an unfinished one of a plurality of subsystems of a system.

EC56) The method of any of EC23 to EC36 wherein at least one of the specified regions is based at least in part on a functional unit of a microprocessor.

EC57) The method of any of EC23 to EC36 wherein at least one of the specified regions is based at least in part on a functional unit of a microprocessor, and the grids collectively cover the microprocessor.

EC58) The method of any of EC23 and EC30 wherein the electrical device is one or more of
- all or any portion of an integrated circuit,
- a semiconductor die,
- a monolithic die,
- a package,
- a die packaged in a package,
- a packaged electronic component,
- all or any portion of a printed circuit board, and
- all or any portion of a printed circuit board and all or any portion of any components electrically or mechanically attached thereto.

EC59) The method of any of EC26 and EC33 wherein the electronic element is one or more of
- all or any portion of an integrated circuit,
- a semiconductor die,
- a monolithic die,
- a package,
- a die packaged in a package,
- a packaged electronic component,
- all or any portion of a printed circuit board, and
- all or any portion of a printed circuit board and all or any portion of any components electrically or mechanically attached thereto.

EC60) The method of any of EC29 and EC36 wherein the electronic device is one or more of
- all or any portion of an integrated circuit,
- a semiconductor die,
- a monolithic die,
- a package,
- a die packaged in a package,
- a packaged electronic component,
- all or any portion of a printed circuit board, and
- all or any portion of a printed circuit board and all or any portion of any components electrically or mechanically attached thereto.

EC61) The method of any of EC23 to EC36 wherein at least some of the grids are hierarchical.

EC62) The method of any of EC23 to EC36 wherein at least some of the regions are hierarchical.

EC63) The method of any of EC23 and EC30 wherein the electrical device is described in accordance with a design hierarchy.

EC64) The method of any of EC26 and EC33 wherein the electronic element is described in accordance with a design hierarchy.

EC65) The method of any of EC29 and EC36 wherein the electronic device is described in accordance with a design hierarchy.

EC66) The method of any of EC63 to EC65 wherein at least some of the regions are hierarchical in accordance with a region hierarchy.

EC67) The method of EC66 wherein the design hierarchy is entirely distinct from the region hierarchy.

EC68) The method of EC66 wherein the design hierarchy is partially in common with the region hierarchy.

EC69) The method of any of EC23 to EC36 wherein one or more of the regions are not specified.

EC70) The method of any of EC23 to EC36 wherein one or more of the regions are not specified, and the resolution of the grid of at least one of the specified regions is a higher resolution than the resolution of the grid of at least one of the not specified regions.

EC71) The method of any of EC23 to EC36 wherein at least one of the specified regions is a localized region.

EC72) The method of any of EC23 to EC36 wherein at least one of the specified regions is a critical region.

EC73) The method of any of EC23 to EC36 further including reducing at least one of the specified regions based at least in part on one or more derived boundary values.

EC74) The method of any of EC23 to EC36 further including reducing at least one of the specified regions that is a critical region based at least in part on one or more derived boundary values.

EC75) The method of any of EC23 to EC36 wherein one of the resolutions is computed by a split function.

EC76) The method of any of EC23 to EC36 wherein one of the resolutions is computed by a hierarchical split function.

EC77) The method of any of EC23 to EC36 wherein one of the resolutions is computed by iterative application of a split function.

EC78) The method of any of EC23 to EC36 wherein each of the resolutions is computed by a respective split function.

EC79) The method of any of EC23 to EC36 wherein a first group of the resolutions are computed by a first split function, and a second group of the resolutions are computed by a second split function.

EC80) The method of any of EC23 to EC36 wherein at least one of the specified regions guides a split function that computes the resolution of the grid of the at least one specified region.

EC81) The method of any of EC23 to EC36 wherein a split function computes the resolution of the grid of at least one of the specified regions based at least in part on the at least one specified region.

EC82) The method of any of EC23 to EC36 wherein the resolutions are based at least in part on the specified regions.

EC83) The method of any of EC23 to EC36 wherein the resolutions are selected based at least in part on the specified regions.

EC84) The method of any of EC23 to EC36 wherein the resolutions are selected according to a priority that is based at least in part on the specified regions.

EC85) The method of any of EC23 to EC36 wherein the grids are selected according to a priority that is based at least in part on the specified regions.

EC86) A method including:
- defining regions, at least one being a user-defined region;
- determining a hierarchy of grids based at least in part on the regions; and
- modeling thermal behavior of an electronic element in accordance with the grids.

EC87) A method including:
- defining regions, at least one being a user-defined region;
- determining a hierarchy of grids based at least in part on the regions; and performing thermal simulation of an electrical device in accordance with the grids.

EC88) A method including:
defining regions, at least one being a user-defined region;
determining a hierarchy of grids based at least in part on the regions; and
determining temperatures of an electronic device at grid points of the grids.

EC89) The method of any of EC86 to EC88 further including providing feedback to a user, the feedback regarding the user-defined region with respect to accuracy.

EC90) The method of any of EC86 to EC88 further including providing feedback to a user, the feedback regarding grid resolution versus accuracy.

EC91) The method of any of EC86 to EC88 further including providing feedback to a user, the feedback regarding grid selection versus accuracy selection.

EC92) A method including:
performing a hierarchical thermal simulation of an electronic element in accordance with a plurality of regions, each of the regions having a respective grid, and each of the grids having a respective resolution in at least one dimension; and
specifying one or more of the regions.

EC93) A method including:
performing a hierarchical annotating of temperatures of an electronic element in accordance with a plurality of regions, each of the regions having a respective grid, and each of the grids having a respective resolution in at least one dimension; and
specifying one or more of the regions.

EC94) A method including:
performing a hierarchical distributing of temperatures of an electronic element in accordance with a plurality of regions, each of the regions having a respective grid, and each of the grids having a respective resolution in at least one dimension; and
specifying one or more of the regions.

EC95) A method including:
performing a hierarchical distributing of temperatures of an electronic element in accordance with a plurality of regions, each of the regions having a respective grid, and each of the grids having a respective resolution in at least one dimension; and
deriving a boundary condition usable to determine one or more of the regions.

EC96) A system implementing any of the foregoing method ECs.

EC97) A computer readable media having instructions contained therein that when executed by a computer cause the computer to perform operations that implement any of the foregoing method ECs.

EC98) A system including:
a processing element; and
a memory;
wherein the memory stores instructions therein that when executed by the processing element cause the processing element to perform operations that implement any of the foregoing method ECs.

EC99) A system including:
means for performing operations that implement any of the foregoing method ECs.

Thermal Simulation Using Adaptive 3D and Hierarchical Grid Mechanisms

FIG. 1 illustrates selected components and operational environment elements of an embodiment of a thermally aware design automation suite with thermal simulation using adaptive 3D and hierarchical grid mechanisms. Thermal Design Automation Suite 1000 is illustrated with related inputs, data, and output. Thermal Design Automation Suite 1000 is adapted to receive a plurality of Inputs 1002a-1002g (hereinafter collectively referred to as "Inputs 1002") and process Inputs 1002 to produce a full-chip (e.g., three-dimensional) thermal analysis of a proposed semiconductor chip design. In some usage scenarios the chip is a die of an integrated circuit, while in other usage scenarios the chip is a die and a package of an integrated circuit.

In some embodiments, the plurality of Inputs 1002 includes industry standard design data 1002a-1002f (e.g., pertaining to the physical chip design or layout under consideration) and Library Data 1002g (e.g., pertaining to the semiconductor devices and interconnects incorporated in the design). The industry standard design data optionally includes one or more of the following types of data: electrical component extraction data and extracted parasitic data (e.g., embodied in SPEFs 1002a), design representations including layout data (e.g., embodied in LEF/DEF files 1002b, GDSII files 1002c and/or text files 1002d), manufacturer-specific techfiles 1002e describing layer information and package models, and user-generated power tables 1002f including design data. For example, the design data includes switching factor information such as E(sw). For another example, the design data includes power source information used by transient thermal analysis. In some embodiments, industry standard design data 1002a-1002f is stored in a design database 1006 such as an open access database or a proprietary database. In some embodiments, Library Data 1002g is embodied in a library that is distributed by a semiconductor part manufacturer or a library vendor. In other embodiments, the library incorporating Library Data 1002g is built in-house by a user.

Thermal Design Automation Suite 1000 includes Thermal Analysis Tools 1010 and Design/Performance Tools/Engines 1030. Thermal Analysis Tools 1010 includes Thermal Engine 1020 enabled to operate using adaptive 3D and hierarchical grid mechanisms, as illustrated conceptually by Adaptive 3D Grid 1998 and Hierarchical Grid 1999. The thermal analysis tools are enabled to perform full-chip thermal analysis of the semiconductor chip under design. The thermal analysis is one or more of a static thermal analysis and a transient thermal analysis. In some usage scenarios, results of a thermal analysis are used to improve and/or repair a design of a semiconductor chip being designed.

Design/Performance Tools/Engines 1030 optionally includes engines (software sub-systems, e.g. as callable tasks and procedures) for providing layout, physical design, and verification services. For example, in some usage scenarios, an included verification service has a circuit simulator that is capable of interfacing to a thermal engine and/or simulator. Design/Performance Tools/Engines 1030 optionally includes tools for performing synthesis, place and route, and various design checks (such as ERC, DRC, and timing checks). For example, in some usage scenarios, an included timing tool is enabled to interface to a thermal engine and/or simulator. The thermal and design/performance tools are enabled to intercommunicate, as conceptually indicated by 1025.

Adaptive 3D Grid Analysis

Spatial distribution of steady-state temperature due to a set of power sources situated in an infinite plane is modeled by computing the temperature profile of each source individually and then summing up the result. Application of the same principle to a semiconductor IC requires the individual temperature profiles to be computed within the confines of the chip boundaries and the different material interfaces that surround the power sources in all three directions. Solving for steady state temperatures within the IC, in some usage scenarios, involves billions of power sources (e.g. active devices, interconnect, and poly resistors) while maintaining boundary conditions at a large number of interfaces (e.g. package, inter layer dielectric, bond pads, and power bumps). Various mathematical schemes (algebraic, finite difference, finite element, boundary element, multi-grid, and integral techniques) have been developed for the solving. In some usage scenarios, building effective models of heat transfer mechanisms that occur within an IC enables more accurate and/or more run-time efficient computational schemes.

Grid-based solutions are used in several applications and various references are available describing grid-based techniques. The choice of the grid strongly influences the runtime, resolution, efficiency, convergence and the accuracy of the grid-based simulations and therefore needs careful consideration. An overly fine grid, in some usage scenarios, results in excessive computational waste and unnecessarily long runtimes. Conversely, an overly coarse grid, in some usage scenarios, results in poor convergence, accuracy, and resolution. Inhomogeneity within the volume being simulated complicates the grid selection.

Timely and accurate convergence of the heat equations for both steady state and transient temperature analysis is achieved through use of locally-specific grid spacing. That is, instead of using a uniform global grid with the same size throughout the IC, the grid size (spacing between grid points) is varied in each of the X, Y, and Z dimensions based on one or more preselected criteria. The selected criteria include local and global conditions of the IC being simulated and meta conditions of the simulation proper. The criteria optionally further selectively dictate that the spacing in one or more of the physical dimensions be changed from iteration to iteration.

A discretization approach effectively models semiconductor IC temperature distributions using heuristics to adaptively grid the space in 3D and simultaneously apply (heat equation) mathematical operators to solve for temperatures within the grid points. Adaptive and locally variable grid spacing techniques are used so that the mathematics converge efficiently and accurately for steady state and/or transient temperature solutions. The grid is variably spaced selectively and independently in each of the coordinate (X, Y, and Z) dimensions. The grid is further selectively varying from iteration to iteration. The resolution of the grid is thus locally adapted (the spacing between grid points is locally varied) as dictated by local conditions in time (iteration space) and space (the three physical dimensions) to optimize predetermined simulation performance criteria. In some embodiments, selectively varying the grid permits lower resolution to be broadly used (yielding shorter run-times) while simultaneously selectively using higher resolution (to provide locally greater accuracy) as a function of local conditions (in time and space).

In a material-boundary grid-topology aspect, grid boundaries are selectively defined between IC materials having differing thermal conductance and the localized grid size (e.g. spacing or granularity) is a function of at least some of the design variables and material characteristics as they are locally applied. Thus, grid placement and spacing is selectively automatically adapted to better model boundary effects. In some embodiments, for at least portions of the simulation, the grid resolution proximate to material boundaries is selectively greater than the resolution elsewhere.

In a rate-of-change grid-topology aspect, the localized grid size is a function of localized rates of change (spatial and temporal) in at least some of the simulated thermally significant variables (such as power or temperature). Furthermore, as the simulation progresses, the localized grid size is recomputed based on the local thermal behavior. Thus, resolution is selectively automatically adapted to better model regions of higher gradients. In some embodiments, the resolution within regions of relatively higher gradients is selectively greater than the resolution elsewhere. Similarly, for transient thermal analysis, temporal rates have analogous split functions that enable fine-level versus coarse-level analysis that overlay the spatial grid.

In a convergence-information grid-topology aspect, based on convergence information obtained as the simulation progresses, the grid size over the iterations of the simulation is globally modified (or a grid adaptation otherwise in accordance with the other aspects is modified) in accordance with predetermined global simulation performance criteria (or strategies). In some embodiments, the grid is selectively globally adapted over time (more specifically, over subsequent iterations) to minimize the simulation run-time consistent with maintaining a simulation accuracy requirement. That is, as the simulation progresses through the iteration sequence, the grid size is repeatedly recomputed with a bias toward relaxation (greater spacing) consistent with keeping errors below a predetermined maximum.

Note that while the grid is recomputed as the simulation progresses in both the rate-of-change and convergence-information aspects, the motivation for the recomputation is fundamentally different. In the rate-of-change aspect, the recomputation is done to refine the local grid spacing in view of updated values for the rates of change of the local thermal variables. In the material-boundary aspect, the recomputation is done to bias the global grid spacing to execute a predetermined simulation performance strategy in view of the relative progress of the simulation. The above described grid-topology aspects are not mutually exclusive, and some embodiments use more than one of the aspects.

Adaptive 3D Grid Steady State and Transient Analyses Strategies

The variable grid approach described herein is flexible, and usable for thermal analysis in any of a wide variety of ways, such as:
(a) performing both transient analysis and steady-state thermal analysis on different portions of the same design;
(b) performing transient analysis followed by steady-state analysis at different times on the whole chip;
(c) performing steady state thermal analysis only;
(d) performing transient thermal analysis only; or
(e) performing other combinations of thermal analysis on other combinations of all or portions of a design and/or a chip.

Transient Analysis Thermal Time Constants

In transient heat transfer solutions, thermal time constants are the analog of electrical time constants, being the product of thermal resistance and thermal capacitance. The thermal resistance of a component is proportional to the length of the medium (extracted within each grid), inversely proportional to cross sectional area perpendicular to the direction of the heat flow, and inversely proportional to the thermal conductivity. Thermal capacitance is extracted from grid points to approximate isothermal volumes. The capacitance is a product of the mass of the element (the element volume contained within the grid as a consequence of the split function) and the specific heat of the medium the heat transfer occurs through.

Local Grid Based on Thermally Related Distributions

Several thermally related distributions of an IC (such as one or more of temperature, power, and thermal conductivity), in some usage scenarios, have regions that are characterized by the nature of the distribution slope within the region. For example, some of the regions are regions of near zero change, some are convex regions, some are concave regions, and other regions are inflection regions between convex and concave regions. It is further useful, in various usage scenarios, to distinguish regions by relative temporal rates of change with respect to other regions, and/or with respect to the overall package encapsulated die. In some embodiments, in accordance with the rate-of-change grid-topology aspect, the grid size is a function of the localized rates of change and the localized grid size is recomputed as the simulation progresses. More specifically, the grid spacing is adaptive such that the convex and concave regions of the thermally related distributions trend toward having finer grid spacing than the regions of near zero change and the inflection regions between convex and concave regions trend toward having still finer grid spacing than the convex and concave regions. An appropriately finer grain grid is used in thermally dynamic regions (such as regions proximate to fractionally large power sources, regions having power sources or sinks of complex shape and aspect ratio, and/or regions otherwise containing significant localized spatial variations in either heat generation or heat dissipation capacities, and regionalized using thermal time constants to enable efficient computation of full chip designs) while an appropriately coarser grain grid is used in regions of relative thermal calm/homogeneity, and heat flux. Stated differently, larger gradients, i.e., more rapid changes (in the thermally related distributions in space) directly result in finer splits (finer grid point spacing).

Local Grid Based on Design Characteristic Indexed Knowledge Base

As in any heuristic approach, there is no guarantee of good results, but in some usage scenarios, use of the material-boundary grid-topology aspect dramatically hastens convergence and improves computational efficiency. In accordance with the material-boundary aspect, grid boundaries are defined between IC materials having differing thermal conductance. Further in accordance with the material-boundary aspect, for at least portions of the simulation, the grid spacing is established based at least in part on anticipated optimal local spacing granularities.

The anticipated optimal local spacing granularities are determined with a variety of techniques, such as one or more of: a) variable grid knowledge and experience for common design scenarios gained from simulations using the rate-of-change grid-topology aspect, b) predictions extrapolated from the knowledge and experience, and c) other techniques to determine efficient local spacing granularities. Stated differently, simulations based at least in part on the rate-of-change aspect offer an opportunity to build knowledge and experience regarding the location, size, spacing, and density of heat sources and heat dissipaters, and boundaries between regions of differing thermal conductivity, in some usage scenarios, eventually drive the local grid to certain terminal (eventually stabilized) spacing granularities. In some embodiments, anticipated optimal local spacing granularities are compiled and/or predicted in conjunction with particular instances and combinations of one or more of the following design characteristics:

a) Power densities of devices and resistor elements in the interconnect;
b) Power source dimensions;
c) Shape factors of power sources;
d) Shape factors of conducting materials between power sources;
e) Dimensions of materials (such as one or more of substrate, channel, dielectric, and other dimensionally-alterable materials) where power sources are embedded;
f) Distances of power sources from each other and package boundaries;
g) Thermal conductivity differences between adjacent materials (such as one or more of dielectric, channel, substrate, package, metal, die-attach, C4 pads, bond wires, and other adjacent materials)
h) Thermal diffusivity of materials within the IC;
i) Estimated temperature and/or power gradients or thresholds thereof;
j) Computed temperature gradients (where the temperature distribution is known);
k) Area concentration of self heating sources (such as one or more of leakage, joule heating, and other heat sources);
l) Thermal conductivity of heat sinking materials (such as one or more of exposed pads within the package, and other heat-dissipating materials or structures); and
m) Thermal time constants (dependent on the specific heat and the thermal conductivity) of the materials within the die and the package.

In some usage scenarios, it is desirable for grid boundaries to coincide with known material boundaries, independent of grid size and iteration considerations. In some embodiments, grid boundaries are maintained throughout the simulation to be coincident to at least a selected plurality of the material boundaries.

Split Functions Overview

Particular grid point location functions are used to define the magnitude and direction of the grid point spacing in 3D throughout an IC being analyzed. The grid point location functions act to "split" the volume of the solution space, and they are referred to herein as "split functions" or "splitting functions". The split functions are adapted to calculate the grid spacing distribution in iteration and 3D coordinate space. The various grid-topology aspects are carried out via the split functions. While in some embodiments any of the grid-topology aspects are used alone for the split functions, other embodiments selectively use more than one (or all of) the aspects. In some embodiments, the split functions are a component of a grid-based analysis control flow discussed in later paragraphs.

In some embodiments, the split functions are enabled to independently specify grid points locations (and thereby spacings) in the X, Y, and Z dimensions in accordance with arbitrary predetermined criteria (or split rules). In other embodiments, a different split rule is used in each dimension. In yet other embodiments, the same split rule governs the spacing in both the X and Y dimensions, and another split rule is used in the Z dimension.

A first exemplary split rule is "maintain an equal rate of variation (in one or more of the variables) over the intervals between grid points" (a.k.a. "equalize delta"). A second exemplary split rule is "between any two grid points keep the rate of variation (in one or more of the variables) below a predetermined maximum" (a.k.a. "bounded maximum delta"). A third exemplary split rule combines the previous two: "maintain the rate of variation (in one or more of the variables) below a predetermined maximum over the intervals between grid points" (a.k.a. "equalize and bound delta").

In some embodiments of the split functions, all of the grid-topology aspects, at least in part, influence the grid size for at least some iterations, but the extent the aspects influence the grid size is selectively varied across the iterations of the simulation in accordance with a predetermined criteria (or strategy). In a first split function example, during at least some iterations, information gained from the rate-of-change grid-topology aspect is used to selectively qualify use of information based on the material-boundary grid-topology aspect. That is, during at least some iterations, the local grid sizing is at least in part generated through the use of local design characteristics and material boundary information that is enabled and/or weighted by the existence and/or relative intensity of local temperature gradients. In a second split function example, during at least some iterations, the local grid sizing is at least in part generated through use of local temperature gradient information to refine the grid sizing suggested by the use of a design characteristic knowledge base.

In various embodiments, various mesh splitting schemes are based on one or more of power, power thresholds, power gradients, power gradient thresholds, temperature, temperature thresholds, temperature gradients, and temperature gradient thresholds. Mesh splitting is performable in any dimension. For example, some of the mesh splitting schemes are in the plane of an existing mesh, e.g. in-plane mesh splitting. For another example, some of the mesh splitting schemes are in a vertical dimension (e.g. orthogonal to a major surface of a die or an existing mesh). In some usage scenarios and/or embodiments, using one or more of the mesh splitting schemes enables relatively more accurate temperature calculations, relatively fewer computational operations for a fixed temperature accuracy, relatively faster convergence toward a temperature solution, or any combination thereof.

The split rules, in some embodiments, vary over the duration of the simulation. In some usage scenarios, it is advantageous to generate splits differently in different simulation phases.

Split functions are realized, in various embodiments, as one or more programmed functions, routines, sub-routines, in-line routines, procedures, macros, or portions thereof.

Relationship of Split Functions to Design Assertions

In some embodiments directed to temperature assertion applications, split functions are temperature assertion aware, adapting the grid as required to be fine enough to insure a grid resolution capable of implementing the assertion. In a first illustrative example, if an assertion is made regarding a temperature relationship between two physical structures on the IC, then the split functions insure that the grid is fine enough to enable resolution of precise temperatures of the two structures. In an illustrative embodiment, the two structures are represented by two points and the split functions establish a grid spacing that is at least as small as the distance between the two points and thus the two points resolve to different temperatures. In a second illustrative example, if an assertion is made that: "point p is less than the maximum temperature Tmax", then the split functions establish a grid surrounding point p that is sufficiently fine to insure the assertion in view of the gradients in the surrounding area.

Grid-Based Analysis Inner-Loop Control Flow

An illustrative embodiment of a variable grid based technique, suitable for steady-state and/or transient temperature analysis, and making use of any combination of the grid-topology aspects, is diagrammed in FIG. 2 and is described as follows:
- A) Establish (read or compute) thermal simulation initial conditions and control settings in the X, Y, and Z directions, including:
  - A1) Establish initial power gradients;
  - A2) Establish initial power source shape-based thermal gradients;
  - A3) Establish initial temperature gradients (and/or thermal time constants); and
  - A4) Establish initial split functions;
- B) Using the split functions (of either A4 or C1b), compute the temperature distribution (and/or thermal time constants);
- C) Proceed based on whether a predetermined inner loop criteria is met:
  - C1) If the inner loop criteria is not met:
    - C1a) Using the temperature distribution (of B), compute the current power, thermal conductivity, and temperature gradients (and/or thermal time constants of the power sources and the material within the die);
    - C1b) Compute split functions (using values updated in C1a, as required), and
    - C1c) Iterate (by continuing at B); else
  - C2) If the inner loop criteria is met, stop iterating and finish (by proceeding to D); and
- D) Using the (loop criteria satisfied) temperature distribution (of B), compute all steady-state final temperature dependent factors (and/or all transient intermediate temperature dependent factors), as desired.

Selected details of the actions of the foregoing embodiment are now described. The above functions A, B, C, C1a, C1b, and D, correspond respectively to functions 2020, 2030, 2040, 2050, 2060, and 2070, of FIG. 2. In some embodiments, in function A1 the establishment of the initial power gradients is based on the power density distribution (power divided by area) of the power per instance of active devices and the power density in resistor shapes.

In some embodiments, in function A2 the establishment of the initial thermal conductivity gradients is based on the ratios of the thermal conductivity of the materials constructing the IC. In some usage scenarios, the ratios of thermal conductivity are largest at package-chip boundaries and in a Z direction (upward or downward in the chip, e.g. orthogonal to a major axis of a die of the chip).

In some embodiments, in function A3 the establishment of the initial temperature gradients is based on a preselected initial temperature distribution model. In at least one preselected initial temperature distribution model, the temperature is constant throughout the IC. In another initial temperature distribution model, the temperature is the result from a previous simulation. In some usage scenarios, (such as when design variations are being evaluated), using the previous simulation result is beneficial. The design variations include one or more of: changing a power source, moving a component or structure, and other modifications to functional or physical factors.

In function C, the predetermined inner loop criteria is general. Exemplary loop criteria are evaluations of one or more of: run time, max delta (over all variables) between iterations is below a predetermined threshold, sum of all deltas (for all variables) between iterations is below a predetermined threshold, grid coarseness (reflecting that the split functions result in a relaxed grid resolution in view of simulation convergence of the gradients); and other loop exit criteria. In some embodiments, the simulation loops (iterates) or not based on whether the values of the temperature distribution (the temperature values) have stabilized within a predefined tolerance value since the previous computation. If stable temperatures are not present, then the iterating continues, otherwise the iterating completes. In steady-state analysis, the inner loop criteria is evaluated with respect to the steady-state temperature distribution. In transient analysis, the inner loop criteria is evaluated with respect to the transient temperature distribution.

In various embodiments, in functions C1a and D a wide variety of temperature dependent factors are optionally calculated, as desired, or as required by goals and constraints of a particular usage scenario. Temperature dependent factors calculated in functions C1a and D optionally are one or more of: power and thermal conductivity distributions; power, thermal conductivity, and temperature gradients; and other temperature dependent parameters and values. In some usage scenarios, simulation convergence is affected by temperature dependence on the other factors.

Simulation Loop Hierarchy

Figure 2:
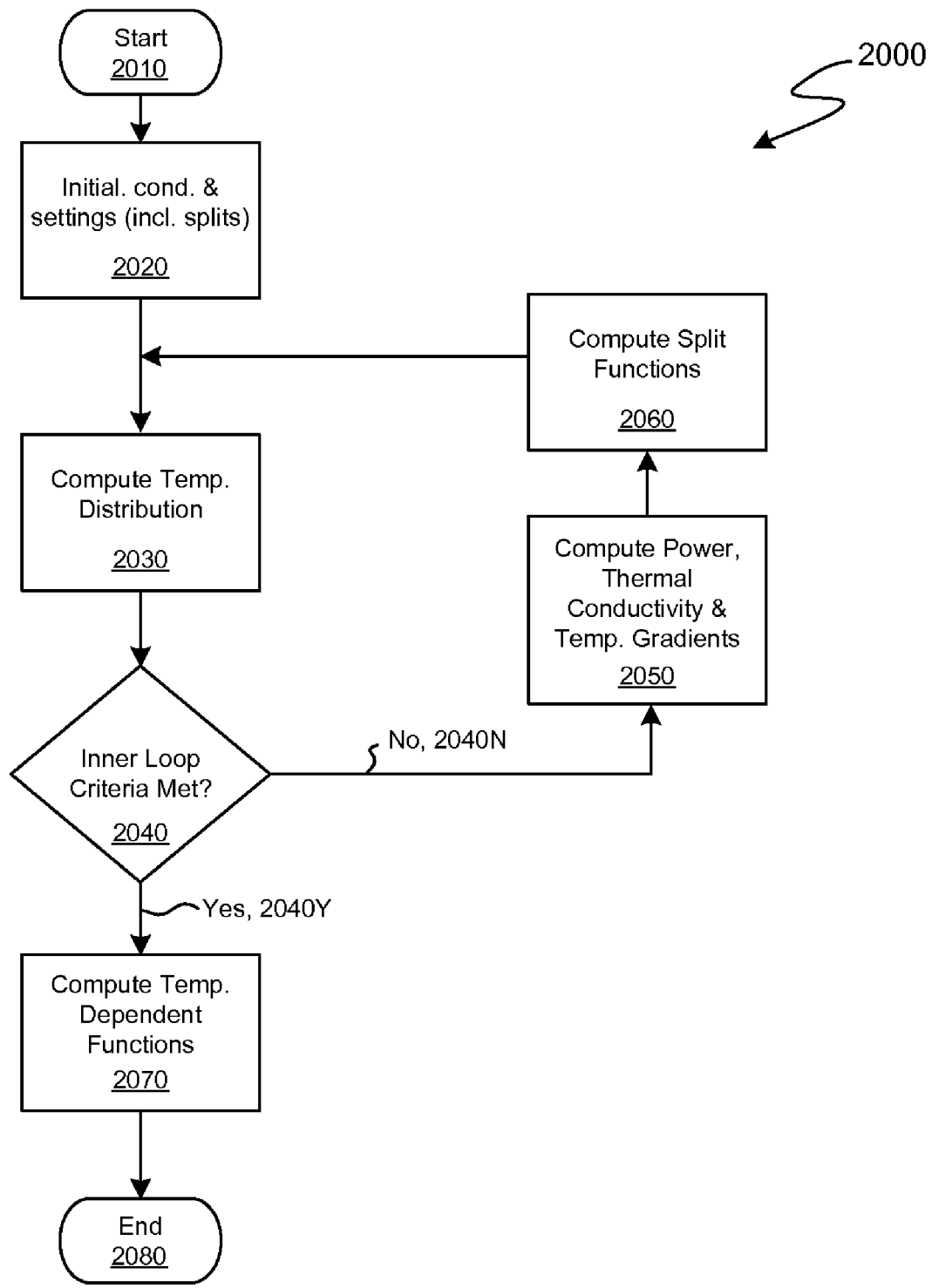
FIG. 2 illustrates an embodiment of an abstract inner loop control flow for variable-grid-based analysis.
Figure 3:
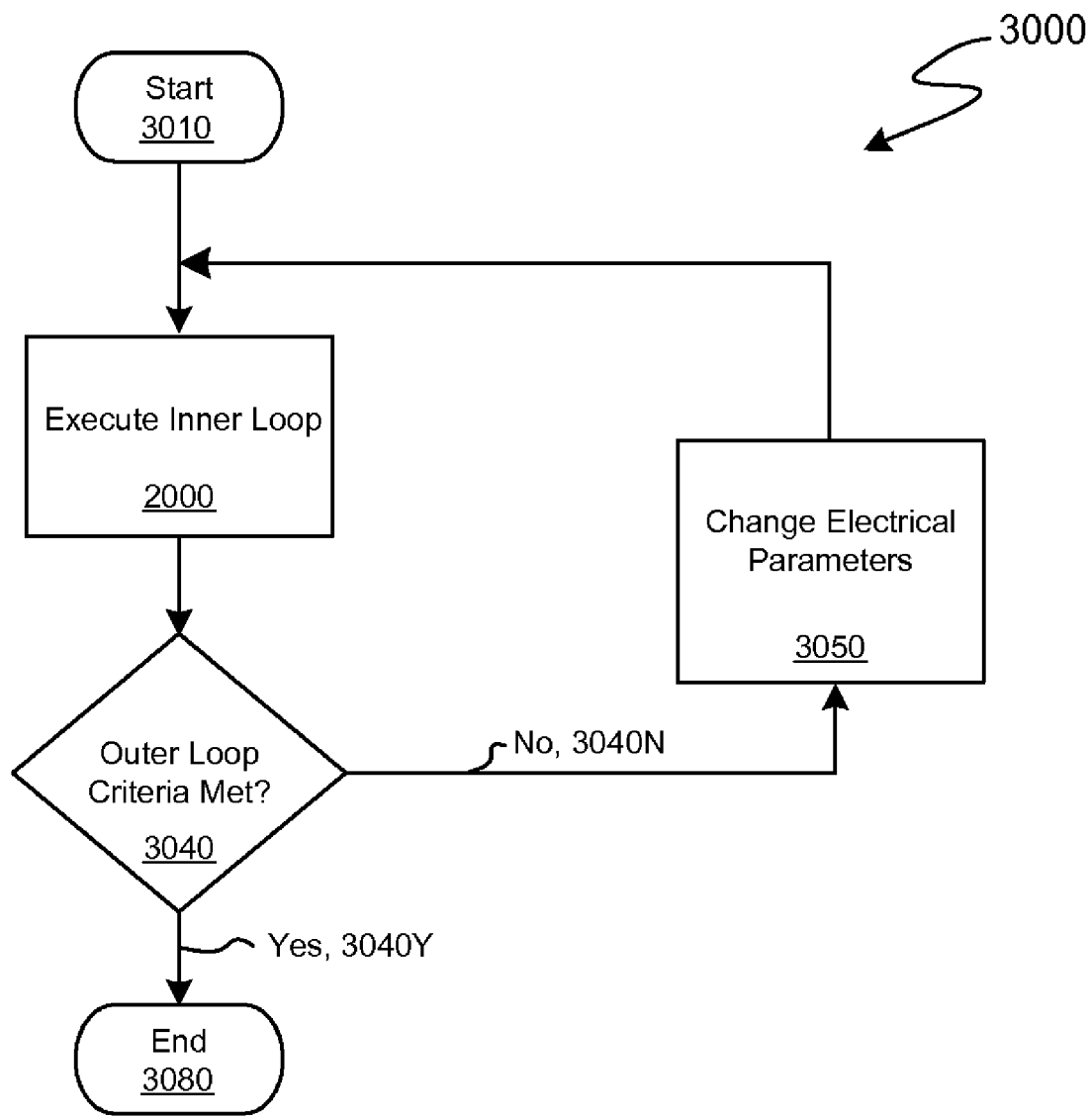
FIG. 3 illustrates an embodiment of an abstract electro-thermal outer loop control flow for variable-grid-based analysis.

While the control flow of FIG. 2 is usable alone, the flow is also used as the "inner loop" 2000 within the electro-thermal "outer-loop" control flow 3000 of FIG. 3. In some usage scenarios and/or embodiments, the inner loop criteria evaluates simulation behavior (or meta-behavior) and/or characteristics, while the outer loop criteria evaluates design behavior and/or characteristics (as determined by the simulation).

In steady-state analysis for example, the inner loop provides simulation results for one configuration of electrical parameters (broadly, all aspects of design, design variables, and/or material characteristics). The inner loop analysis is then repeated as required in accordance with a predetermined design automation strategy/algorithm that conceptually is implemented by changing electrical parameters (at function 3050) as a function of the results of inner loop 2000 and conditional on the evaluation of an outer loop criteria (at function 3040). In a first example, the outer loop is used to sequence through a succession of design variations for subsequent evaluation of which particular variation represented an optimal design for a given set of design requirements. (The sequence optionally exits early if an optimal design is recognizable during the sequencing.) In a second example, the outer loop supports one or more design assertions. In some instances of the second example, the design assertions are supported by tracking one or more error terms related to the assertion(s) and dynamically changing the electrical parameters to drive the error terms toward zero until the assertion(s) is(are) met.

In a transient analysis example, the outer loop criteria evaluates (at function 3040) for electrical failure conditions that are possibly present at intermediate states in the analysis. The safe/failure conditions are a function of library element characteristics. For example, a failure is indicated upon detection that an element self-heated in excess of a predefined safe power range. In another example, a failure is indicated upon detection that an aggressor device heated a victim device outside a predefined safe temperature range (e.g. the victim temperature is above a specified temperature threshold). If any failure conditions are detected, then the electrical parameters are changed (at function 3050), and the inner loop 2000 re-executed as required, until the outer loop criteria 3040 establishes that the electrical conditions (corresponding to the most recent inner loop iteration) are safe for the design.

Split Function Variation in Different Simulation Phases

With respect to some embodiments, it is useful to conceptualize multiple simulation phases (or regimes) with respect to split function operation. The phases are herein defined as: "coarse grid", "simplified grid", and "detailed variable grid" phases. As is described below, use of one or more of the phases varies by embodiment. Conceptually, the use of multiple phases in an embodiment is construed as a variation of the convergence-information grid-topology aspect. Split function operation in the detailed variable grid phase is, in some embodiments, as previously overviewed.

Split function operation in the coarse grid phase is characterized by operation with a relatively coarse grid during the interval from simulation start through initial convergence. The relatively coarse grid enables, in some usage scenarios, achieving convergence quickly albeit at relaxed accuracy and is followed by one or more subsequent phases that implement a relatively finer grid to refine the simulation accuracy. Thus, the overall simulation more efficiently uses available computational resources. The relatively coarse grid is determined via any number of techniques. In some embodiments, the relatively coarser grid of the coarse grid phase is achieved by using a selected fraction of the design characteristics information available for the design being simulated. In other embodiments, an intermediate grid is computed first using any of the approaches described herein for use in the other phases and then the grid scaled up by a predetermined factor to a coarser resolution.

Split function operation in the simplified grid phase is in some way simplified relative to that of detailed variable grid operation. In various embodiments, any combination of an iso-grid split function and a global (iso-spaced) split function is at least sometimes used as part of a simplified grid phase. An example of an iso-grid is a variant of a variable grid where grid elements are equal in the mesh. In some usage scenarios, the global (iso-spaced) grid is computationally more efficient to establish than a localized (variably-spaced) grid. In some usage scenarios, global grids are computationally inefficient. A different approach to split function operation in the simplified grid phase is discussed below, as is an example simplified global split function.

Various embodiments are contemplated, such as a) an embodiment operating in the detailed variable grid phase; b) an embodiment operating first in the simplified grid phase and subsequently in the detailed variable grid phase; c) an embodiment operating first in the initial convergence phase and subsequently in the detailed variable grid phase; d) an embodiment operating first in the initial convergence phase, then the simplified grid phase, and finally the detailed variable grid phase; e) an embodiment operating first using a previous simulation result and subsequently in the detailed variable grid phase; and f) other embodiments operating in various grid configurations during various phases. Other embodiments perform several iterations at a global level to determine initial temperatures that are interpolated onto an intermediate grid. Then several iterations on critical regions are performed (e.g. to refine grid splitting to enable, in some usage scenarios, more accurate results). In some usage scenarios, some of the foregoing embodiments have applicability in evaluating a succession of design variations (such as embodiments operating first using a previous simulation result and subsequently using a detailed variable grid phase).

Runtime Choice of Simplified Grid Split Functions

In the different approach to simplified grid phase embodiments, a runtime choice is made between use of a simplified global split function or a simplified localized split function. In some embodiments, the runtime choice is dependent on the die area and the ratio of the die area of the individual power sources.

If the die area is relatively large or the die area is consumed by fractionally large power sources (such as designs having power transistors with hundreds of fingers), the simplified localized split function is used. The simplified localized split function generates a localized grid based on a simplified set of considerations. Example simplified sets of considerations include one or more of: a fractional contribution of localized power source areas to total die size area, existence of local power source shapes other than rectilinear or 45 degrees, local gradient values of power density and thermal conductivity, and other relatively low complexity criteria. That is, for at least some iterations, the granularity of the grid spacing is adaptively locally reduced (the grid spacing is made finer) as a function of proximity to significant heat sources, complex shapes, and regions of rapid change in either heat generation or heat dissipation.

If the die area is relatively small and individual power sources are a small fraction of the die area, (such as some usage scenarios of standard-cell based designs) the simplified global grid split function is used. The grid spacing that results is, in some usage scenarios, unnecessarily fine for much of the IC, but since the die area is small, the initial computational inefficiency of the overly fine global grid is tolerated in exchange for reduced computational requirements relative to a localized grid. The simplified global split function generates a global grid based on a simplified set of considerations. Example simplified sets of considerations include one or more of: maximum gradients of power density and thermal conductivity of the IC, die area of the IC, the area and shape of the power sources, and other relatively low complexity criteria. That is, for at least some iterations, the grid spacing is set everywhere fine enough to handle the regions of worst case change in either heat generation or dissipation.

In various embodiments, one or more of the adaptive 3D grid analysis techniques are used in performing one or more of the design repair and/or improvement techniques.

Thermal Analysis Shell

Figure 4:
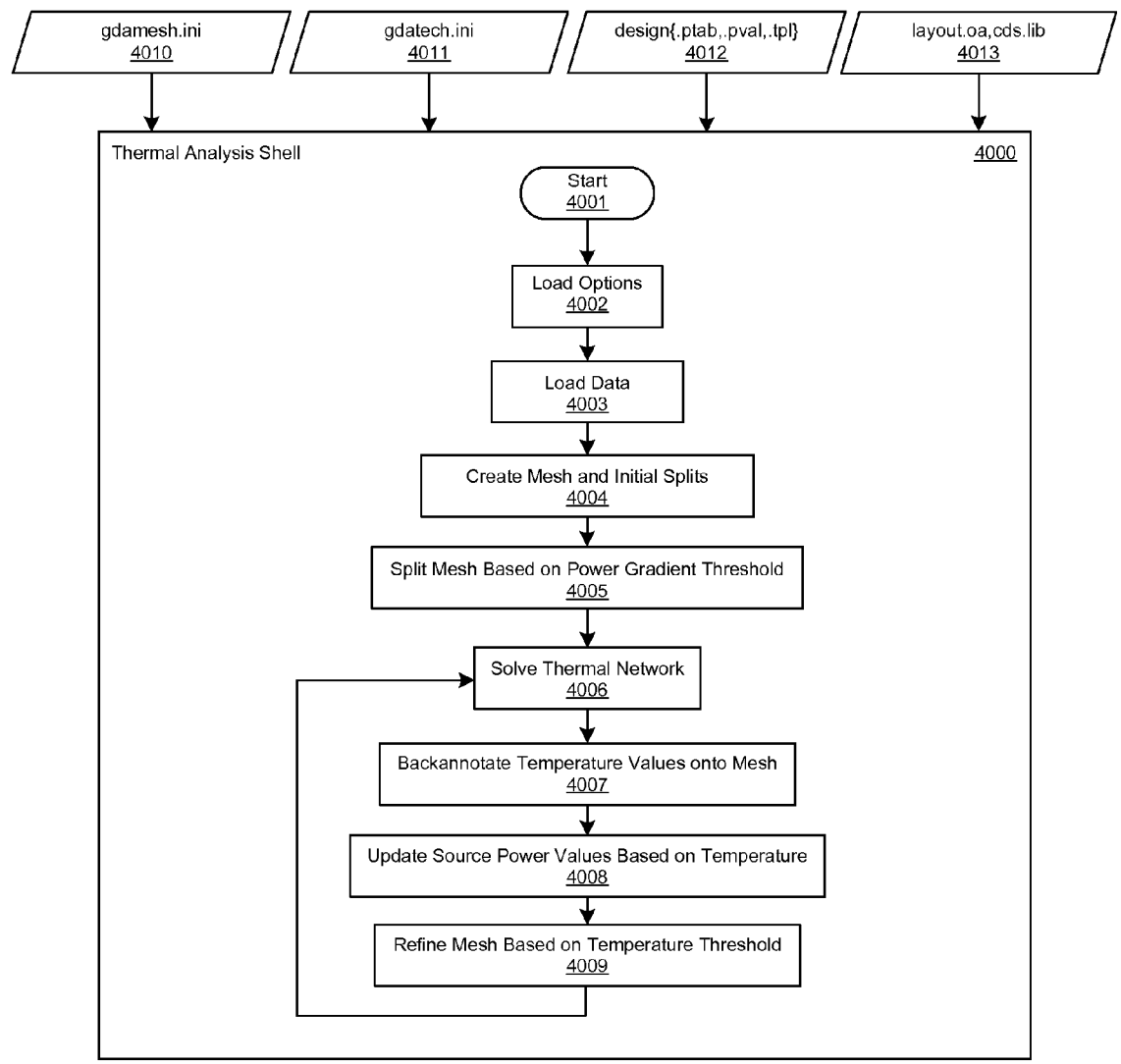
FIG. 4 illustrates a flow diagram of an embodiment of a thermal analysis shell and an associated operating context.

FIG. 4 illustrates a flow diagram of an embodiment of a thermal analysis shell and an associated operating context. In various embodiments, Thermal Analysis Shell 4000 uses or embodies one or more of the techniques illustrated by or described with respect to FIGS. 2 and FIG. 3. In some embodiments, the analysis shell is part of Thermal Design Automation Suite 1000 of FIG. 1. The shell provides 3D thermal extraction and analysis by computing a temperature distribution given a power distribution, material extents, and thermal properties of mask layers and packaging of an IC. In some usage scenarios, information produced by the shell enables designers to better address various design tasks, such as package selection/design, reliability prediction/improvement, and performance estimation.

More specifically, the shell is invoked ("Start" 4001), and proceeds to read settings relating to analysis ("Load Options" 4002). The settings include a specification of an arbitrary mesh ("gdamesh.ini" 4010) that enables control of spatial resolution of a temperature solution (such as the temperature distribution) of a design under test (such as a target of the 3D thermal analysis). The shell then reads data specific to technology associated with the design, as well as data specific to the design proper ("Load Data" 4003). The data includes technology information including a description of physical properties of the design being analyzed (such as physical properties of an IC die and a package associated with the IC) and properties of an environment of a context of the analysis ("gdatech.ini" 4011). The data further includes design-specific information including a listing of power sources of the design, and optionally one or more areas of interest to focus the analysis on ("design.ptab" with respect to 4012). The design-specific information further includes a specification of initial power values associated with the power sources ("design.pval" with respect to 4012). The design-specific information further includes a table of temperature versus power for each source, enabling table lookup models for temperature-dependent power estimation ("design.tpl" with respect to 4012). The design-specific information optionally further includes a binary file having layout information ("layout.oa" with respect to 4013) and a specification of a library location within a file hierarchy ("cds.lib" with respect to 4013). In some embodiments, the layout information is in a format compatible with an open access (e.g. industry standard "OpenAccess") file format.

Flow then proceeds to define one or more meshes ("Create Mesh and Initial Splits" 4004 and "Split Mesh Based on Power Gradient Threshold" 4005) in accordance with power gradients and power gradient thresholds (e.g. where a respective power gradient exceeds a respective power gradient threshold). Flow then proceeds to an iteration beginning with determining a solution to a thermal network representative of the design ("Solve Thermal Network" 4006). The iteration continues by updating temperatures of the solution onto the mesh ("Backannotate Temperature Values onto Mesh" 4007). The iteration further continues with revising respective power values based on the temperatures ("Update Source Power Values Based on Temperature" 4008). The iteration further continues with determining one or more new mesh granularities based on the temperatures and a temperature threshold ("Refine Mesh Based on Temperature Threshold" 4009). The iteration loop is then complete, and flow continues to repeat the iteration, beginning with "Solve Thermal Network" 4006.

In some embodiments, the iteration is exited based on one or more design-specific and/or analysis-specific criteria. In some embodiments, the iteration is exited based on one or more outer loop criteria (such as the outer loop criteria described in conjunction with function 3040 of FIG. 3).

Alternative embodiments perform mesh splitting using other techniques. For example, instead of defining a mesh in accordance with power gradients and power gradient thresholds (e.g. as in "Split Mesh Based on Power Gradient Threshold" 4005), alternative embodiments define a mesh in accordance with one or more temperature thresholds (e.g. where a respective temperature exceeds a respective temperature threshold). In various usage scenarios, defining a mesh in accordance with temperature thresholds enables greater accuracy (such as lower error bounds) and/or improved efficiency (such as faster convergence) in temperature computation (e.g. due to improved mesh splits), compared to defining the mesh in accordance with power gradients and power gradient thresholds.

For example, in some usage scenarios, if a mesh is split and resultant discrete mesh points enable power sources to be split sufficiently, then temperature results are relatively more accurate. For another example, in some usage scenarios, if a mesh is split such that a critical region mesh and an intermediate region mesh (based, e.g., on derived boundary conditions) are sufficiently matched, then relatively faster convergence results. For yet another example, in some usage scenarios, if an initial temperature for a hierarchical mesh is derived from a parent mesh, then relatively faster convergence results when a critical region is solved using the hierarchical mesh.

Temperature thresholds are based on various parameters and characteristics, according to various embodiments. For example, a temperature threshold is defined in accordance with an increase in transistor current beyond a safe operating limit. For another example, a temperature threshold is defined with respect to reliability, such as temperature bias instability, or package material breakdown. For yet another example, a temperature threshold is defined with respect to a temperature differential between individual transistors of a matched transistors pair, such that the individual transistors no longer operate in a matched manner. In some embodiments, a temperature threshold is determined automatically. For example, a user provides characteristics, and a temperature threshold is determined from the characteristics (such as determining an unsafe temperature based on user-provided power-temperature data and a power threshold for safe operation).

In some usage scenarios, mesh defining is selectively based at least in part on how heat escapes from an IC. For example, in some usage scenarios where relatively more heat escapes in relatively few directions (such as via a major surface of a die, e.g. via the bottom or the top of the die), meshes are defined in accordance with power gradients and/or power gradient thresholds. Further in the example, in some usage scenarios where relatively more heat escapes simultaneously in relatively many directions (such as via the bottom, the top, and the sides of the die), meshes are defined in accordance with one or more estimated temperature gradients and/or estimated temperature thresholds. In some circumstances where the example is applicable, and meshes are defined (e.g. split such as in a vertical dimension) in accordance with estimated temperature gradients, results are relatively more accurate and accuracy at relatively far distances from heat sources is improved. One of the circumstances where the example is applicable is when a heat source size is large compared with a vertical thickness of material (e.g. substrate, metal layer, or dielectric layer) under (or on top of) the heat source.

In some usage scenarios, accuracy is improved by using temperature gradients (instead of, for example, using power gradients) to define meshes. In some situations this is because power gradients are based on individual power sources and ignore mutual interaction of the power sources, and thus inaccurately reflect cumulative effects of the power sources at far fields. Using temperature gradients accounts for interactions of power sources and cumulative temperature effects at far fields, and thus enables improved accuracy, in some usage scenarios.

In some usage scenarios, mesh defining is selectively based at least in part on whether or not there are relatively concentrated (e.g. physically localized) sources of relatively large power within the IC, such as a power transistor that significantly affects temperature at a relatively long distance (e.g. to or near an interface of a die and a package). For example, in usage scenarios where there are no or relatively few concentrated power sources, meshes are defined in accordance with power gradients and power gradient thresholds. Further in the example, in usage scenarios where there are some or relatively many concentrated power sources, meshes are defined in accordance with one or more estimated temperature thresholds.

Mesh defining, in various embodiments, is according to a single scheme throughout an entire region (e.g. an entire die or IC). Mesh defining, in other embodiments is according to a plurality of schemes for a respective plurality of regions. The schemes are in accordance with any combination of factors, such as power, power gradients, or thresholds thereof; temperature, temperature gradients, or thresholds thereof; how heat escapes an IC; or existence, location, or density of concentrated power sources. For example, in a region of an IC having a large power transistor, a mesh is defined based on power or temperature thresholds, while in another region of the IC lacking power transistors, a mesh is defined based on power.

In some embodiments, operation in accordance with temperature thresholds includes computations based on a multi-layer Green's function and is thus is conceptually "grid-less". Operation in accordance with temperature thresholds optionally includes estimating temperature distribution based on power data of power sources in an IC, with boundary conditions as used in computations with respect to a thermal network (such as computations relating to "Solve Thermal Network" 4006).

In some embodiments, the analysis displays results in a GUI window (such as a Qt-based window). In some embodiments, an initial window displays a 2D layout of power sources at a specific layer. Temperatures on different layers are viewable by using a GUI input (such as a graphical slider or a mouse wheel). In various embodiments, various result displays include one or more of: a 3D temperature display, a 3D temperature gradient display, a 3D display of a temperature gradient magnitude in a single dimension (such as X or Y dimensions), a 3D power display, and other displays of other results and inputs. In some embodiments, the mesh and/or quantization associated with the analysis are optionally displayable in conjunction with the displays of the results.

In some embodiments, the GUI window accepts one or more commands, such as one or more of the following: a command to refine the mesh (such as operations similar to all or portions of one or more of "Split Mesh Based on Power Gradient Threshold" 4005 and "Refine Mesh Based on Temperature Threshold" 4009), a command to perform a loop through a simulator (such as an iteration from "Solve Thermal Network" 4006 through "Refine Mesh Based on Temperature Threshold" 4009), and other commands to analyze or modify analysis of the design.

The analysis optionally generates a text file with a listing of all power sources, respective temperatures associated with each power source, and respective final power values used to calculate each respective temperature. In some embodiments, the analysis generates a text file of a listing of all layout polygons with respective mask layer and respective coordinates, along with respective temperatures for each of the polygons.

Mesh Initialization File

In some embodiments, a mesh initialization file (a.k.a. meshfile, such as "gdamesh.ini" 4010 of FIG. 4) enables a user to control discretization, and consequently, spatial resolution of a temperature solution of a physical volume (such as a control volume) being analyzed. The meshfile provides for specifying various parameters according to various embodiments, including one or more of: an initial seed, a reseed count, a reseed alpha parameter, a refine count, a refine alpha parameter, a refine beta parameter, a simulate count, and a model type parameter. The initial seed is a positive, non-zero integer-valued parameter that specifies an initial discretization across a surface of the control volume, resulting in a particular number of uniformly spaced control elements along X and Y axes, the particular number being two raised to the initial seed power. Thus the initial spatial resolution of the solution is determined. In some embodiments, the resolution is identical across all layers of the design.

Figure 5:
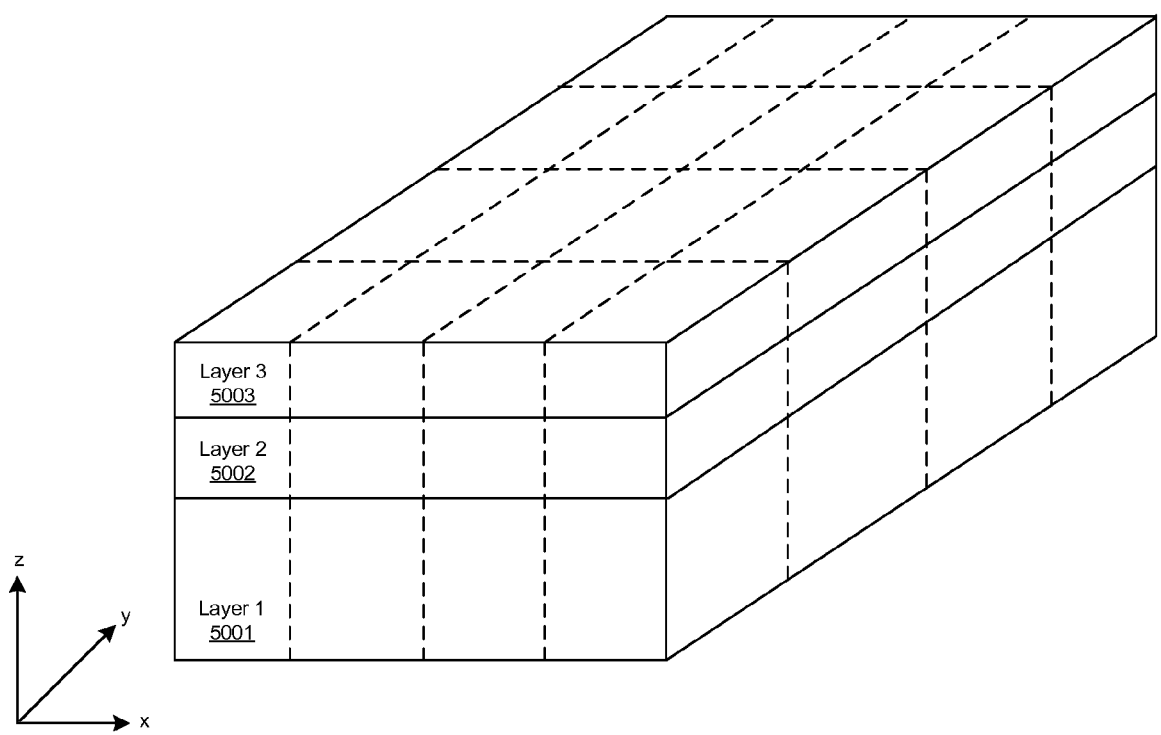
FIG. 5 illustrates an example control volume in accordance with an initial seed of two.

FIG. 5 illustrates an example control volume in accordance with an initial seed of two. Four (two raised to the second power) control volumes in each of the X and the Y axes are present, in each of three layers stacked in the Z axis ("Layer 1" 5001, "Layer 2" 5002, and "Layer 3" 5003).

The reseed count is a positive integer-valued parameter that specifies a number of times (such as iterations) the discretization is refined to improve spatial resolution of the solution before any temperature is calculated. At each iteration, and for each control element, values of the power gradients (with respect to neighbors in the X and the Y axes) are checked. If one of the values exceeds a threshold, then the element is halved in the respective direction. The reseed alpha parameter is a real number that specifies the threshold. Note that the refinement of the discretization before temperature calculation is a first phase of adaptive mesh generation, and in some usage scenarios enables improved resolution of the temperature solution where power gradients are high. Subsequent phases of the adaptive mesh generation are driven by other parameters, described elsewhere herein.

The refine count is a positive integer-valued parameter that specifies a number of times (such as iterations) the discretization is refined, to improve spatial resolution of the temperature solution. Refinement iterations are performed after at least one solution of discretized volume, such as when at least one estimation of mesh temperatures is available. During each refinement iteration, values of temperature gradients across the control element (such as between the center of the element and each face in the X and the Y axes) is checked. If the value is greater than a threshold, then a number of divisions (such as of the control volume) is determined as the square root of one plus a calculation. The calculation is the refine beta parameter (specified as a real number) multiplied by the value of the temperature gradient. The refine alpha parameter is a real number specifying the threshold.

The simulate count is a positive integer-valued number that specifies a number of updates of the power source values, the updates being based on temperature as determined by the analysis. After each update iteration, the temperatures of mesh vertices are recalculated, and the power source values are updated in accordance with the recalculated temperatures. In some usage scenarios, convergence to a steady-state condition occurs unless a run-away condition is present in the design.

The model type parameter specifies a thermal model level for the analysis. Increasing levels, starting with zero, specify improved accuracy. In some usage scenarios and/or embodiments, improved accuracy modeling uses correspondingly more computational resources.

Operation of Hierarchical Grid Thermal Analysis

A chip is partitioned in accordance with critical region(s), e.g. areas of the chip that are critical to designers or users of chip design software. In some usage scenarios, a critical region is more efficiently and/or more accurately analyzed using detailed and fine grain (e.g. high resolution) thermal analysis for accurate temperature simulations. A split function determines and/or characterizes critical regions, and the critical regions are optionally iterated more by the split function than other regions. In some embodiments and/or usage scenarios, grids within regions adjacent to the critical regions are also split, to eliminate or reduce large differentials between the critical and the adjacent regions. Thus local grid refinement of the critical regions "ripples" outward from the critical region, increasing grid count in the adjacent regions. In some situations, the local grid refinement extends to one or more boundaries of the chip, potentially leading to large grid counts that reduce performance of solvers used in the temperature simulations.

In the following description, two-dimensional (2D) examples and embodiments are described for brevity and clarity of description of thermal simulation concepts. However, the examples and the thermal simulation concepts are readily applicable to three-dimensional (3D) examples and embodiments.

Figure 6:
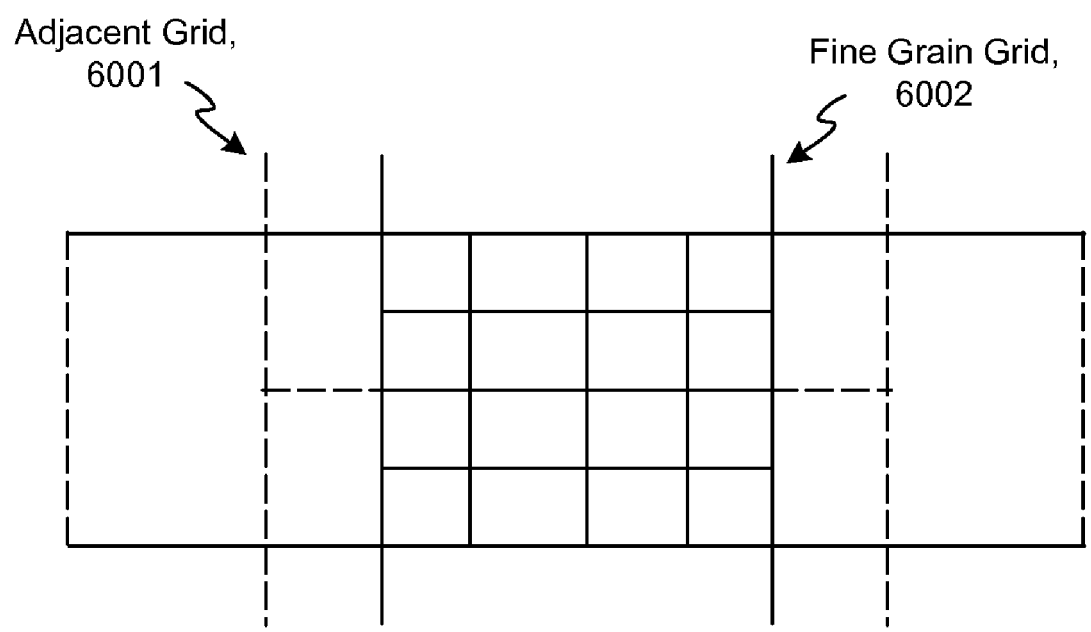
FIG. 6 illustrates selected details of an embodiment of grid regions for simulation of Integrated Circuit (IC) temperature distributions.

FIG. 6 illustrates selected details of an embodiment of grid regions for simulation of IC temperature distributions. A fine grain grid region is illustrated with solid lines, as exemplified by Fine Grain Grid 6002. Adjacent grids are illustrated as dotted lines, as exemplified by Adjacent Grid 6001. If the critical region is the fine grain grid region illustrated with solid lines, then in some embodiments the adjacent regions extend to an edge of a die of the IC or alternatively to the edge of a package of the IC.

Figure 7:
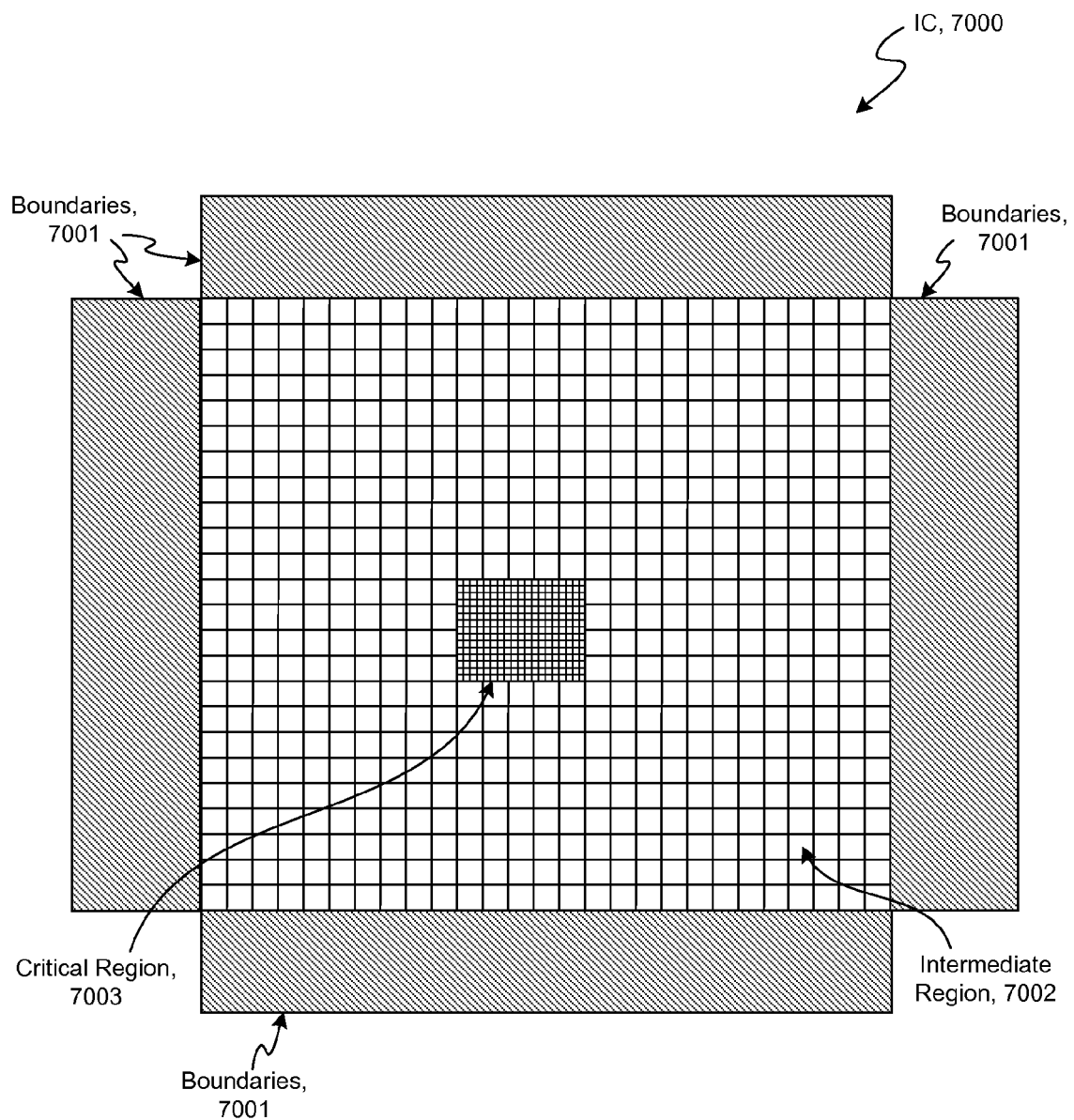
FIG. 7 illustrates selected details of an embodiment of grid regions with respect to a critical region for simulation of IC temperature distributions.

FIG. 7 illustrates selected details of an embodiment of grid regions with respect to a critical region for simulation of IC temperature distributions. IC 7000 is illustrated as partitioned into several regions. Critical region 7003 is illustrated having a finer grid in the center. The finer grid enables higher accuracy temperature simulation. Boundaries of the IC (such as a die boundary or a package boundary) are illustrated as four cross-hatched regions (Boundaries 7001) surrounding Intermediate Region 7002. The intermediate region is illustrated as having a coarser grid than the critical region. Although the coarser grid is illustrated as a uniform grid, in some embodiments the coarser grid is non-uniform (such as variable or adaptive). In some usage scenarios, the critical region is relatively small compared to a total region being simulated, and thus if the finer grid of the critical region is used, for example, throughout the intermediate region, then potentially many unnecessary grid points exist in the intermediate region. The unnecessary grid points consume additional computing resources with little or no increase in accuracy.

Some embodiments operate to reduce or minimized the unnecessary grid points, such as any extra grid points outside of the critical region, via hierarchical grid refinement to produce a hierarchy of grids. Hierarchical grids refer to multiple levels of grid resolution generated by split function(s), resulting in progressively finer grids within various regions of application of the split function(s). Note that in other contexts, hierarchical refers to levels of a design hierarchy (such as a top level hierarchy of an entire integrated circuit or a low-level hierarchy of a leaf cell of a portion or a module of an integrated circuit). Design hierarchies are determined by partitioning a design (such as by a user). Hierarchical grids are independent of design partitioning and methodology, and are also independent of techniques used to define the critical regions. Critical regions are definable according to one or more of: natural or physical boundaries such as geometries of components, floorplans and regions defined therein, regions defined by users, and regions selected automatically based on power and/or temperature distributions.

Critical regions (e.g. partitioned sections of an IC, a die of an IC, a package of an IC, or any combination thereof) are, in some embodiments, user defined and are analyzed with a higher-resolution grid than other regions. Information provided by the user via the user defining specifically points out regions to more accurately analyze. The user defining is direct, indirect, or both. Examples of direct user defining are a specific area and/or a portion of a floorplan. Examples of indirect user defining are: devices of a specific type, devices larger than a threshold size, devices having instance names matching a specific pattern, and instances of specific co-located devices.

Figure 8:
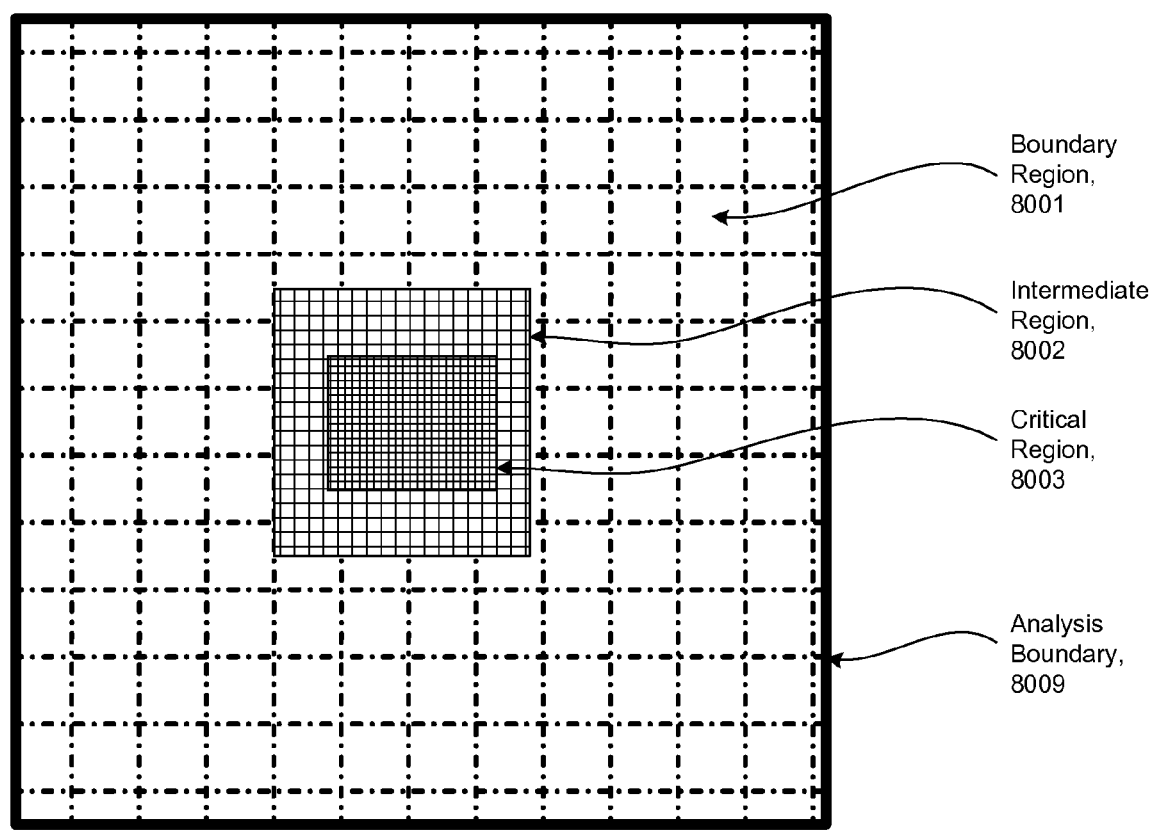
FIG. 8 illustrates selected details of an embodiment of hierarchical grid regions for simulation of IC temperature distributions.

FIG. 8 illustrates selected details of an embodiment of hierarchical grid regions for simulation of integrated circuit temperature distributions. Three (hierarchical) regions are illustrated: Boundary Region 8001 having an (initial) coarse grid, Intermediate Region 8002, and Critical Region 8003. Analysis Boundary 8009 is illustrated by a dark/bold rectangle marking the edge of the boundary region. The coarse grid of the boundary region is for interpolation of boundary conditions from outside the critical region to the intermediate region. The intermediate region provides coarsening of the grid between the critical region and the boundary region. The boundary region provides further coarsening of the grid until boundary conditions are met at the analysis boundary. The analysis boundary is optionally definable via absolute terms such as a constant temperature, a constant heat flux value, or a combination thereof. One or more of the illustrated regions are defined by the user, directly, indirectly, or both.

As illustrated, the intermediate region has a coarser grid than the critical region, and a finer grid than the boundary region. In other embodiments, an intermediate grid is the same resolution as one of one or more critical regions or alternatively as one of one or more boundary regions. An intermediate region is optionally a relatively small set of neighbor grid points defined to properly achieve (derived) boundary conditions between critical and boundary regions. Thus in some situations, fewer total grid points are used by hierarchical regions (e.g. intermediate, critical, and/or boundary) than by a non-hierarchical (e.g. a flat) region.

Adaptive adjustment of grids within critical regions and surrounding regions (e.g. to boundaries of a chip) enables, in some usage scenarios, a reduction in total grid points and improved efficiency of temperature analysis and/or simulation. The critical region is specified specifically for finer resolution analysis (e.g. the critical region grid is "seeded" for finer resolution). Outside the critical region coarser grids are used.

In some usage scenarios and/or embodiments, several critical regions are specified. Regions not specified as critical regions, but found by a split function to be candidates for finer grid analysis, are pointed out to the user. In some embodiments, coarsening within an intermediate region is controlled, at least in part, by user-specifiable parameters, such as desired simulation accuracy within the intermediate region, or a size, such as a radial width of the intermediate region. In further embodiments, the user is notified if user-specified settings lead to a larger loss of accuracy (in any combination of regions) than a user-specifiable threshold.

In some embodiments, critical regions are separated (e.g. isolated) from other regions by deriving respective boundary conditions of the respective critical region from boundary conditions of the entire IC (e.g. the full chip design) all the way to the boundary of the respective critical region. In a context illustrated by FIG. 8, for example, temperature and/or heat flux values at the analysis boundary and the boundary region are reflected (e.g. interpolated) to the intermediate region. Deriving boundary conditions around the critical region from surrounding conditions enables creating a region having a fixed grid around the periphery of the critical region. The derived boundary conditions form a buffer zone around the critical region. In some embodiments, the derived boundary conditions are treated as fixed value points in solutions formulated during thermal simulation, thus preventing "propagation" of any finer grid of the critical region (such as by a split function).

Intermediate region boundaries are, in various embodiments, derived from temperature and/or power information, such as by deriving an intermediate region so that power sources outside the intermediate region have relatively little thermal effect on power sources within the intermediate region, a critical region, or both. For example, temperature contributions of aggressor power sources on power sources at boundaries of a critical region are analyzed to determine one or more intermediate region boundaries with respect to the critical region. For another example, an extent of an intermediate region is determined based on total contribution to temperature rise of points (or power sources) within a critical region being less than a temperature threshold.

Analogous to a split function, a derived boundary condition function is alternatively coarse-grained or fine-grained according to various usage scenarios. The derived boundary condition function, in various embodiments, is linear or non-linear, or reflexive of boundary conditions, for example, when a critical region extends to an analysis boundary (such as a side or edge of a chip or die). In some embodiments, the derived boundary condition function is based on a power distribution profile and any (supplied) fixed boundary conditions.

Derived boundary condition functions are optionally iteratively operable to support multiple levels of hierarchical grids, forming one or more hierarchical analysis regions. Hierarchical application of derived boundary condition functions enables recursively applying a split function to a focused region of interest while continuing to buffer other regions with a sequence of derived boundaries. The hierarchical application thus provides a scalable technique for run-time reduction and/or optimization for various fine-grain (e.g. detailed or detailed-level) analyses and simulations.

After the hierarchical regions are computed, a full chip interpolation function updates contributions of temperatures of the hierarchical regions to any regions surrounding the hierarchical regions. Temperature values of the surrounding regions are held constant (based on analysis boundary conditions and boundary region conditions, as well as initial split function results) until the updating is applied, thus avoiding order dependency of the hierarchical region computation and the temperature values of the surrounding regions.

In some usage scenarios, hierarchical regions are overlapping, in whole or in part. Similarly, different intermediate regions are overlapping, in whole or in part. Respective overlapping hierarchical regions optionally have distinct respective user-specifiable parameters, such as accuracy or grid coarseness/fineness.

While usage scenarios of the illustrated example embodiments have rectangular grid regions, other usage scenarios and/or embodiments are contemplated with unrestricted grid regions of any 2D or 3D shape, configuration, or size. The unrestricted grid regions correspond to one or more levels of grid hierarchy. In some usage scenarios and/or embodiments, a hierarchical grid region is limited to a subset of layers of one or more dice of an IC.

Hierarchical Grid Thermal Analysis Techniques

Several thermal analysis techniques using hierarchical regions are described. A first technique is based on one or more manually specified or automatically determined critical regions. A second technique is based on one or more derived boundary conditions associated with regions external to the critical regions, such as one or more intermediate regions. A third technique is based on one or more physical boundary conditions and zero or more derived boundary conditions.

Figure 9:
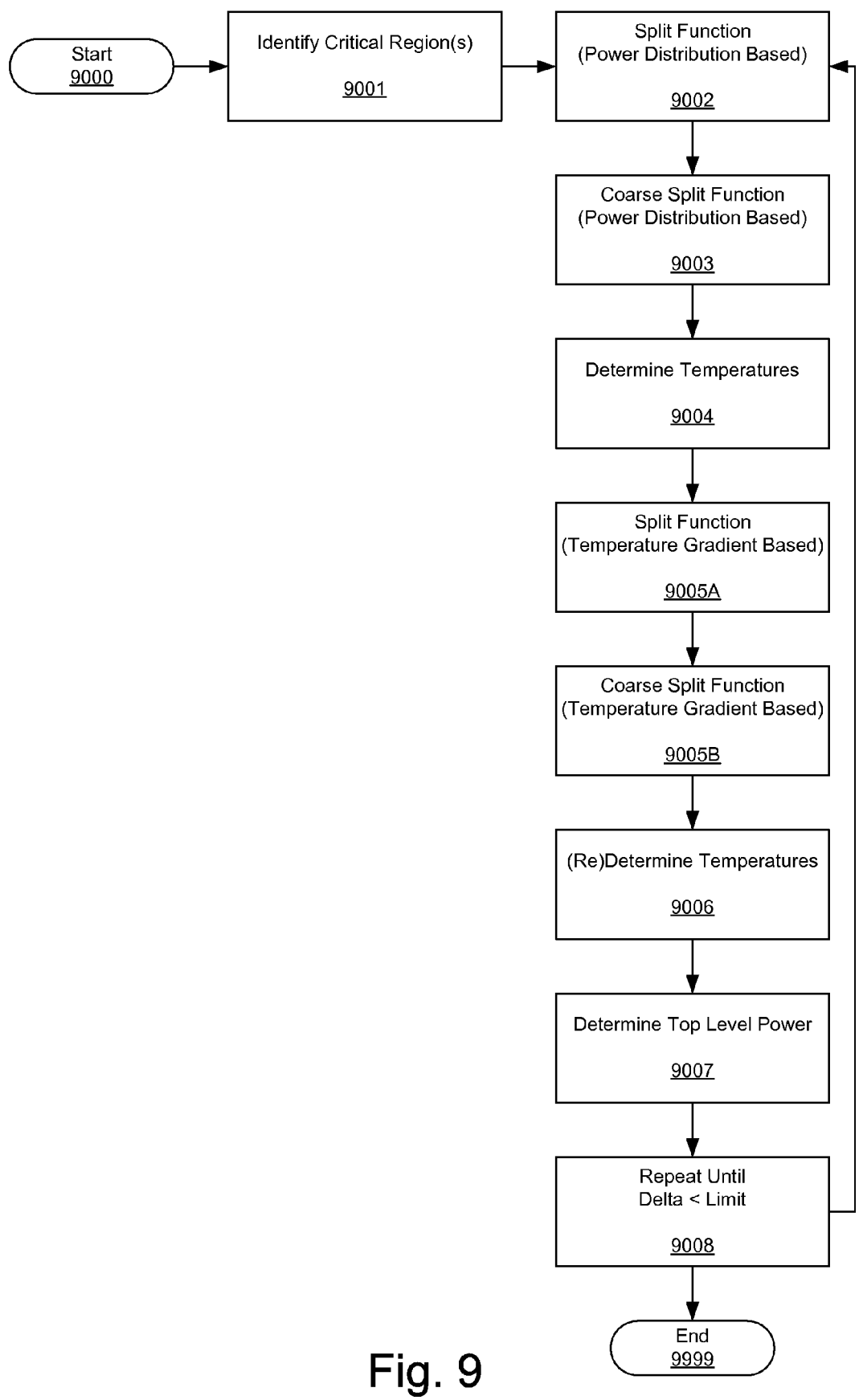
FIG. 9 illustrates selected details of an embodiment of a thermal analysis technique using hierarchical region(s) based on one or more specified or determined critical regions.

FIG. 9 illustrates selected details of an embodiment of a thermal analysis technique using hierarchical region(s) based on one or more specified or determined critical regions. The first technique uses one or more of the actions illustrated in the figure. The figure illustrates the following actions.

Start 9000: Begin processing.

Identify Critical Region(s) 9001: A user manually specifies critical region(s) for thermal analysis via a 2D or a 3D coordinate system. Alternatively, software automatically determines the critical regions using power density based techniques (such as disclosed in the PCT application entitled Simulation of IC Temperature Distributions Using an Adaptive 3D Grid cited elsewhere herein). Further alternatively, software automatically determines the critical regions by inference from design parameters, such as power source instances, or by component name and/or types, or by other mechanisms. A top level region is assigned, for example to the dimensions of a die being analyzed, a die and a package being analyzed, or a die, package, and board being analyzed, in accordance with fixed boundary conditions defined by the user.

Split Function (Power Distribution Based) 9002: A split function is applied to the critical region(s) based on power distribution.

Coarse Split Function (Power Distribution Based) 9003: A coarser level split function is applied in a zone extending out from the critical region(s) to an analysis boundary (such as corresponding to the fixed boundary conditions defined by the user). The coarser level split function serves to smooth out power and/or temperature gradients. In some embodiments, coarsening is accelerated in one or more specified regions around the critical region (s).

Determine Temperatures 9004: Temperatures and/or temperature gradients are computed based on the grids resulting from application of the split functions according to actions Split Function 9002 and Coarse Split Function 9003.

Split Function (Temperature Gradient Based) 9005A and Coarse Split Function (Temperature Gradient Based) 9005B: Actions Split Function 9002 and Coarse Split Function 9003 are repeated using respective split functions based on temperature gradients (instead of power distribution).

(Re)Determine Temperatures 9006: Temperatures and/or temperature gradients are computed based on the grids resulting from Split Function (Temperature Gradient Based) 9005A and Coarse Split Function (Temperature Gradient Based) 9005B.

Determine Top Level Power 9007: Power of the top level is updated based on results of (Re)Determine Temperatures 9006.

Repeat Until Delta<Limit 9008: Actions Split Function 9002 through Determine Top Level Power 9007 are performed iteratively until temperature changes between iterations are less than a tolerance limit.

End 9999: Processing is complete.

The second technique is similar to the first technique, but is based on a boundary condition derived from some or all regions external to the critical region(s). The derived boundary condition is applied to a grid forming a buffer zone around the critical region(s). The split function is applied iteratively to the critical region(s) based on power and temperature respectively, thus providing accurate temperatures within the critical region(s) using a derived boundary condition. The temperatures of the critical region(s) are annotated at the end of processing of all the critical region(s) to avoid order dependency of temperature calculations of the critical region(s). In some embodiments, the boundary conditions are derived recursively for critical region(s) that are defined within other critical region(s), thus containing or localizing grid spreading to the lowest level critical region(s) defined in an analysis of a design.

In some embodiments where critical regions are separated (e.g. isolated) from other regions by appropriate derivation of respective boundary conditions, annotation of temperatures to critical regions is performable as soon as new temperatures are available (e.g. annotation of temperatures to critical regions is not restricted to the end of processing). The annotation is also performable as soon as new temperatures are available in some embodiments where intermediate region(s) have been derived so that other region(s) outside the intermediate region(s) have relatively little thermal effect on critical region(s) within the intermediate region(s).

The third technique conceptually operates according to the first technique to determine initial temperatures, and then operates according to the second technique to refine critical regions. More specifically, initial temperatures for all critical regions are determined based at least in part on physical boundary conditions. Then the critical regions (and associated intermediate regions) are refined at least once (e.g. using a hierarchical grid) based at least in part on derived boundary conditions.

Any of the foregoing techniques are applicable to steady state and to transient thermal analyses. During steady state analysis, some or all of the actions associated with any of the foregoing techniques are applicable to creating an analysis mesh and initial splits, and are applicable to subsequent mesh splitting. For example, the actions are applicable to "Create Mesh and Initial Splits" and/or "Split Mesh Based on Power Gradient Threshold" of FIG. 20 in the PCT application entitled Simulation of IC Temperature Distributions Using an Adaptive 3D Grid cited elsewhere herein. During application in transient analysis, some or all of the actions associated with any of the foregoing techniques are applicable with respect to one or more mesh updates. For example, the actions are applicable to "Grid based on power distribution (coarsen or refine)" and/or "Set $t_{start}$ to a prior snapshot to $t_{event}$; Grid based on Temperature; Integrate on interval $t_{event}$-$t_{start}$ using electrical simulation state at $t_{event}$" of FIG. 2 in the U.S. Non-Provisional application entitled Transient Thermal Analysis cited elsewhere herein.

According to various embodiments and/or usage scenarios, Thermal Design Automation Suite 1000 of FIG. 1 includes program instructions (realized, for example, as one or more functions, routines, sub-routines, in-line routines, procedures, macros, or portions thereof) to perform one or more operations as illustrated and described with respect to one or more of FIGS. 2-9, with communication between thermal and electrical engines/tools as indicated by 1025 of FIG. 1. For example, in some embodiments Thermal Design Automation Suite 1000 includes one or more routines to perform inner loop control flow for variable-grid-based analysis as illustrated by FIG. 2. For another example, in some embodiments Thermal Design Automation Suite 1000 includes one or more routines to perform electro-thermal outer loop control flow for variable-grid-based analysis as illustrated by FIG. 3. For yet other examples, in various embodiments Thermal Design Automation Suite 1000 includes one or more routines to perform operations relating to a thermal analysis shell as illustrated by FIG. 4, a control volume as illustrated by FIG. 5, grid regions as illustrated by FIG. 6 and FIG. 7, hierarchical grid regions as illustrated by FIG. 8, and thermal analysis as illustrated by FIG. 9. Other arrangements of processing as illustrated and described elsewhere herein are contemplated.

Computer System

Figure 10:
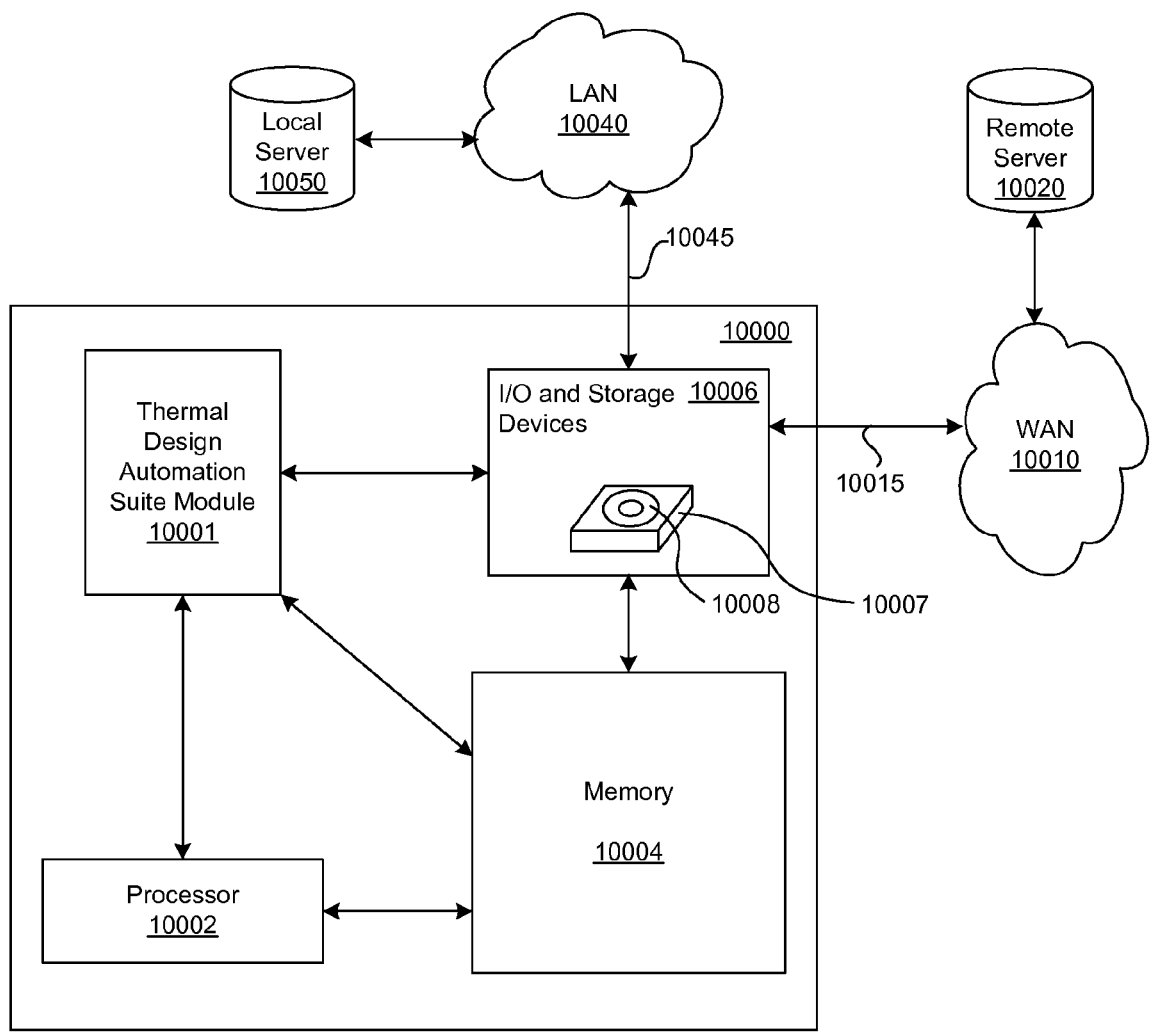
FIG. 10 illustrates an example computer system environment associated with the thermally aware design automation suite of FIG. 1.

FIG. 10 illustrates an example computer system environment associated with the thermally aware design automation suite of FIG. 1. Computer System 10000 is a general purpose computing system such as a PC, Workstation, or Server, and includes a Processor 10002, a Memory 10004, Thermal Design Automation Suite Module 10001, and various I/O and Storage Devices 10006. The I/O and Storage Devices include any combination of a display, a keyboard, a mouse, a modem, a network connection, a magnetic disk drive, an optical disk drive, and similar devices. In various embodiments, any or all of the aforementioned procedures (such as "Thermal Analysis Tools" 1010, "Thermal Engine" 1020, and optionally all or portions of "Design/Performance Analysis Tools" 1030 of FIG. 1) are implemented via Thermal Design Automation Suite Module 10001. In some embodiments, all or any portion of Thermal Design Automation Suite 1000 are implemented via Thermal Design Automation Suite Module 10001.

In some embodiments, Thermal Design Automation Suite Module 10001 is provided as a physical device or sub-system (such as a hardware accelerator) that is coupled to a processor through a communication channel. Alternatively, the module is provided as one or more software applications (or even a combination of software and hardware, e.g., using ASICs), where the software is loaded from a storage medium (such as from I/O and Storage Devices 10006) and executed as instructions by Processor 10002 via Memory 10004 of Computer System 10000. Thus, in some embodiments, Thermal Design Automation Suite Module 10001, described herein with reference to the preceding figures, is stored on a computer readable medium or carrier (e.g., RAM, magnetic or optical drive or diskette, and similar storage media; see removable media 10007 and media reader 10008).

In various embodiments, Thermal Analysis Shell 4000 of FIG. 4 uses or embodies one or more of the techniques illustrated by or described with respect to FIGS. 5-9.

Additionally, the software optionally runs in a distributed or partitioned fashion on two or more computing devices similar to Computer System 10000. The collaborating computing devices are optionally linked via network connection 10045 to Local Area Network 10040 and via network connection 10015 to Wide Area Network 10010. Furthermore, networked Local Server 10050 and Remote Server 10020 are used, in various embodiments, for one or more of: library and data storage, program updates, license validation, and other uses.

EXAMPLE IMPLEMENTATION TECHNIQUES

In some embodiments, various combinations of all or portions of operations performed by a physical device or sub-system (such as a hardware accelerator optionally associated with or included in Thermal Design Automation Suite Module 10001 of FIG. 10), and portions of a processor, microprocessor, system-on-a-chip, application-specific-integrated-circuit, or other circuitry providing all or portions of the aforementioned operations, are specified by descriptions compatible with processing by a computer system. The specification is in accordance with various descriptions, such as hardware description languages, circuit descriptions, netlist descriptions, mask descriptions, or layout descriptions. Example descriptions include: Verilog, VHDL, SPICE, SPICE variants such as PSpice, IBIS, LEF, DEF, GDS-II, OASIS, or other descriptions. In various embodiments the processing includes any combination of interpretation, compilation, simulation, and synthesis to produce, to verify, or to specify logic and/or circuitry suitable for inclusion on one or more integrated circuits. Each integrated circuit, according to various embodiments, is designed and/or manufactured according to a variety of techniques. The techniques include a programmable technique (such as a field or mask programmable gate array integrated circuit), a semi-custom technique (such as a wholly or partially cell-based integrated circuit), and a full-custom technique (such as an integrated circuit that is substantially specialized), any combination thereof, or any other technique compatible with design and/or manufacturing of integrated circuits.

In some embodiments, various combinations of all or portions of operations as described by or with respect to any of FIGS. 2-9, are performed by execution and/or interpretation of one or more program instructions, by interpretation and/or compiling of one or more source and/or script language statements, or by execution of binary instructions produced by compiling, translating, and/or interpreting information expressed in programming and/or scripting language statements. The statements are compatible with any standard programming or scripting language (such as C, C++, Fortran, Pascal, Ada, Java. VBscript, and Shell). One or more of the program instructions, the language statements, or the binary instructions, are optionally stored on one or more computer readable storage medium elements. In various embodiments some, all, or various portions of the program instructions are realized as one or more functions, routines, sub-routines, in-line routines, procedures, macros, or portions thereof.

CONCLUSION

Certain choices have been made in the description merely for convenience in preparing the text and drawings and unless there is an indication to the contrary the choices should not be construed per se as conveying additional information regarding structure or operation of the embodiments described. Examples of the choices include: the particular organization or assignment of the designations used for the figure numbering and the particular organization or assignment of the element identifiers (i.e., the callouts or numerical designators) used to identify and reference the features and elements of the embodiments.

The words "includes" or "including" are specifically intended to be construed as abstractions describing logical sets of open-ended scope and are not meant to convey physical containment unless explicitly followed by the word "within."

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description, and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications, are merely those of the described embodiments, are expected to track improvements and changes in implementation technology, and should not be construed as limitations.

Functionally equivalent techniques known in the art are employable instead of those described to implement various components, sub-systems, operations, functions, routines, sub-routines, in-line routines, procedures, macros, or portions thereof. It is also understood that many functional aspects of embodiments are realizable selectively in either hardware (i.e., generally dedicated circuitry) or software (i.e., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design are insubstantial changes over the teachings conveyed by the described embodiments. It is also understood that the embodiments described herein have broad applicability to other applications, and are not limited to the particular application or industry of the described embodiments. The invention is thus to be construed as including all possible modifications and variations encompassed within the scope of the claims of the issued patent.

What is claimed is:

1. A method comprising:
specifying a first thermal analysis region of an integrated circuit;
applying a first grid determining function to the first thermal analysis region with inputs comprising a power distribution of the integrated circuit;
applying a second grid determining function to a second thermal analysis region that extends outward from at least a portion of the first thermal analysis region; and
performing, at least in part via at least one processor, at least a portion of a thermal analysis of the integrated circuit in accordance with first and second grid resolutions respectively determined by the first and the second grid determining functions.

2. The method of claim 1, wherein the second thermal analysis region is within the integrated circuit.

3. The method of claim 1, wherein the at least a portion of the thermal analysis is a first portion of the thermal analysis and the applying of the first grid determining function is a first applying of the first grid determining function; and further comprising a second applying of the first grid determining function to the first thermal analysis region with inputs comprising gradients of temperatures produced by the first portion of the thermal analysis and then performing at least a second portion of the thermal analysis in accordance with a third grid resolution determined by the second applying of the first grid determining function.

4. The method of claim 1, wherein the thermal analysis comprises computing temperatures at grid points in accordance with the first and the second grid resolutions.

5. The method of claim 1, wherein the thermal analysis comprises computing temperature gradients with respect to grid points in accordance with the first and the second grid resolutions.

6. The method of claim 1, wherein the first grid determining function is based on gradients of the power distribution.

7. The method of claim 1, wherein the first thermal analysis region is a critical region, and the first grid resolution is finer than the second grid resolution.

8. The method of claim 7, wherein a power transistor is within the critical region.

9. The method of claim 1, wherein the specifying is manually via a user.

10. The method of claim 1, wherein the specifying is automatically via software.

11. The method of claim 1, wherein the specifying is based at least in part on power density.

12. A non-transitory computer-readable storage medium having a set of instructions stored therein that when executed by a processing element cause the processing element to perform operations comprising:
receiving a specification of a first thermal analysis region of an integrated circuit;
determining a first grid resolution based at least in part on power gradient thresholds of the integrated circuit;
determining a second grid resolution that is coarser than the first grid resolution; and
computing temperatures at grid points determined by applying the operation that determines the first grid resolution to the first thermal analysis region and by applying the operation that determines the second grid resolution to a second thermal analysis region that extends outward from at least a portion of the first thermal analysis region.

13. The non-transitory computer-readable storage medium of claim 12, wherein the second thermal analysis region is within the integrated circuit.

14. The non-transitory computer-readable storage medium of claim 12, wherein the operations further comprise iteratively using the computing temperatures operation until an error value is less than a predetermined threshold to determine temperatures of a static thermal simulation.

15. The non-transitory computer-readable storage medium of claim 12, wherein the operations further comprise iteratively using the computing temperatures operation until an error value is less than a predetermined threshold to determine temperatures of at a particular simulation time of a transient thermal simulation.

16. The non-transitory computer-readable storage medium of claim 12, wherein the operations further comprise determining the specification.

17. The non-transitory computer-readable storage medium of claim 12, wherein at least one of the grid resolutions is fixed in at least one spatial dimension.

18. The non-transitory computer-readable storage medium of claim 12, wherein at least one of the grid resolutions is variable in at least one spatial dimension.

19. The non-transitory computer-readable storage medium of claim 12, wherein at least one of the grid resolutions is in accordance with a boundary value.

20. A non-transitory computer-readable storage medium having a set of instructions stored therein that when executed by a processing element cause the processing element to perform operations comprising:
receiving a specification of a first thermal analysis region of an integrated circuit;
determining a first grid resolution based at least in part on temperature thresholds of the integrated circuit;
determining a second grid resolution that is coarser than the first grid resolution; and
computing temperatures at grid points determined by applying the operation that determines the first grid resolution to the first thermal analysis region and by applying the operation that determines the second grid resolution to a second thermal analysis region that extends outward from at least a portion of the first thermal analysis region.

21. The non-transitory computer-readable storage medium of claim 20, wherein the second thermal analysis region is within the integrated circuit.

22. The non-transitory computer-readable storage medium of claim 20, wherein the operations further comprise iteratively using the computing temperatures operation until an error value is less than a predetermined threshold to determine temperatures of a static thermal simulation.

23. The non-transitory computer-readable storage medium of claim 20, wherein the operations further comprise iteratively using the computing temperatures operation until an error value is less than a predetermined threshold to determine temperatures of at a particular simulation time of a transient thermal simulation.

24. The non-transitory computer-readable storage medium of claim 20, wherein the operations further comprise determining the specification.

25. The non-transitory computer-readable storage medium of claim 20, wherein at least one of the grid resolutions is fixed in at least one spatial dimension.

26. The non-transitory computer-readable storage medium of claim 20, wherein at least one of the grid resolutions is variable in at least one spatial dimension.

27. The non-transitory computer-readable storage medium of claim 20, wherein at least one of the grid resolutions is in accordance with a boundary value.

28. A system comprising:
a processing element; and
a memory;
wherein the memory is enabled to store instructions therein that when executed by the processing element cause the processing element to perform operations comprising:
a first grid determining operation operable at least in accordance with a power distribution of an electronic device and enabled to determine a first grid resolution,
a second grid determining operation enabled to determine a second grid resolution, the second grid resolution being coarser than the first grid resolution,
a specification receiving operation enabled to receive a specification of a first thermal analysis region of the electronic device, and
a temperature computing operation enabled to compute temperatures at grid points determined by applying the first grid determining operation to the first thermal analysis region and by applying the second grid determining operation to a second thermal analysis region that extends outward from at least a portion of the first thermal analysis region.

29. The system of claim 28, wherein the operations further comprise an iteration control operation enabled to iteratively invoke the temperature computing operation until an error value is less than a predetermined threshold.

30. The system of claim 28, wherein the operations further comprise a critical thermal analysis region determining operation enabled to determine the first thermal analysis region.

31. The system of claim 28, wherein the operations further comprise a thermal simulation shell enabled to perform at least one of a static thermal simulation and a transient thermal simulation at least in part by using results of the temperature computing operation.

32. The system of claim 28, wherein at least one of the grid resolutions is fixed in at least one spatial dimension.

33. The system of claim 28, wherein at least one of the grid resolutions is variable in at least one spatial dimension.

34. The system of claim 28, wherein at least one of the grid resolutions is in accordance with a boundary value.

35. A method comprising:
applying a first grid determining function to a first thermal analysis region with inputs comprising a power distribution of an integrated circuit;
deriving boundary conditions that define a second thermal analysis region of the integrated circuit;
applying a second grid determining function to the second thermal analysis region; and
performing, at least in part via at least one processor, at least a portion of a thermal analysis of the integrated circuit in accordance with first and second grid resolutions respectively determined by the first and the second grid determining functions.

36. The method of claim 35, wherein the boundary conditions are between the first and the second regions.

37. The method of claim 35, wherein the first region is a critical region, the second region is an intermediate region, and the boundary conditions are between the critical and the intermediate regions.

38. The method of claim 35, wherein the deriving boundary conditions is directed to reduce total contribution to temperature rise of the first region to be less than a temperature threshold.

* * * * *